United States Patent
Lee et al.

(10) Patent No.: US 10,748,905 B2
(45) Date of Patent: Aug. 18, 2020

(54) SEMICONDUCTOR DEVICES AND METHODS OF FORMING THE SAME

(71) Applicant: Samsung Electronics Co., Ltd., Suwon-si, Gyeonggi-do (KR)

(72) Inventors: Dong-jin Lee, Seoul (KR); Sang-kwan Kim, Hwaseong-si (KR); Ji-eun Lee, Suwon-si (KR); Sung-hak Cho, Hwaseong-si (KR); Seok-hyang Kim, Seoul (KR); So-yeon Shin, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/033,302

(22) Filed: Jul. 12, 2018

(65) Prior Publication Data

US 2018/0331111 A1   Nov. 15, 2018

Related U.S. Application Data

(63) Continuation of application No. 15/331,069, filed on Oct. 21, 2016, now Pat. No. 10,050,038.

(30) Foreign Application Priority Data

Jun. 16, 2016 (KR) ................. 10-2016-0075097

(51) Int. Cl.
*H01L 27/108* (2006.01)
*H01L 21/28* (2006.01)
*H01L 23/528* (2006.01)
*H01L 29/08* (2006.01)
*H01L 29/423* (2006.01)
(Continued)

(52) U.S. Cl.
CPC .. *H01L 27/10823* (2013.01); *H01L 21/28088* (2013.01); *H01L 23/528* (2013.01); *H01L 27/10814* (2013.01); *H01L 27/10852* (2013.01); *H01L 27/10876* (2013.01); *H01L 27/10894* (2013.01); *H01L 29/0847* (2013.01);
(Continued)

(58) Field of Classification Search
CPC ............. H01L 29/7813; H01L 29/4236; H01L 29/7825; H01L 29/66613–66628; H01L 29/42336; H01L 29/42352; H01L 27/10823; H01L 21/28088
See application file for complete search history.

(56) References Cited

U.S. PATENT DOCUMENTS

2012/0080749 A1*  4/2012  Purtell ................ H01L 29/51
                                                        257/334
2015/0214362 A1*  7/2015  Oh ................... H01L 29/7827
                                                        257/330
(Continued)

FOREIGN PATENT DOCUMENTS

KR    10-2009-0081615       7/2009
KR    10-2013-0110599      10/2013

*Primary Examiner* — Tucker J Wright
(74) *Attorney, Agent, or Firm* — Myers Bigel, P.A.

(57) ABSTRACT

Semiconductor devices are provided. A semiconductor device includes a substrate, and a source/drain region in the substrate. Moreover, the semiconductor device includes a gate structure in a recess in the substrate. The gate structure includes a liner that includes a first portion and a second portion on the first portion. The second portion is closer, than the first portion, to the source/drain region. The second portion includes a metal alloy. Methods of forming a semiconductor device are also provided.

18 Claims, 30 Drawing Sheets

(51) Int. Cl.
*H01L 29/49* (2006.01)
*H01L 29/51* (2006.01)

(52) U.S. Cl.
CPC ...... *H01L 29/4236* (2013.01); *H01L 29/4966* (2013.01); *H01L 29/517* (2013.01)

(56) References Cited

U.S. PATENT DOCUMENTS

2015/0349073 A1* 12/2015 Kang ................ H01L 29/66621
257/330
2016/0172488 A1    6/2016 Oh et al.

* cited by examiner

SEMICONDUCTOR DEVICES AND METHODS OF FORMING THE SAME

CROSS-REFERENCE TO RELATED APPLICATION

This application is a continuation application of and claims priority from U.S. patent application Ser. No. 15/331,069, filed on Oct. 21, 2016, which claims the benefit of Korean Patent Application No. 10-2016-0075097, filed on Jun. 16, 2016, in the Korean Intellectual Property Office, the disclosures of which are hereby incorporated by reference in its entirety.

BACKGROUND

The present disclosure relates to semiconductor devices. An increase in the integration density of semiconductor devices and the downscaling of the semiconductor devices have led to decreasing sizes of gate electrodes of transistors. With reduced gate electrode size, an interconnection resistance of a semiconductor device including the gate electrode may increase, and a distance between the gate electrode and a drain region may be reduced. Thus, a leakage current of a transistor may increase.

SUMMARY

Various embodiments of present inventive concepts may provide a semiconductor device capable of reducing a leakage current of a transistor, and a method of forming/manufacturing the device.

Moreover, various embodiments of present inventive concepts may provide a semiconductor device capable of reducing a resistance of a gate electrode, and a method of forming/manufacturing the device.

A semiconductor device, according to some embodiments of present inventive concepts, may include a semiconductor substrate. The semiconductor device may include a source/drain region in the semiconductor substrate. Moreover, the semiconductor device may include a gate structure in a recess in the semiconductor substrate. The gate structure may include a liner that includes a first portion and a second portion on the first portion. The second portion may be closer, than the first portion, to the source/drain region, and may include a metal alloy.

A semiconductor device, according to some embodiments, may include a substrate. The semiconductor device may include first and second source/drain regions in the substrate. Moreover, the semiconductor device may include a buried gate structure in the substrate. The buried gate structure may include a first work function control portion. The buried gate structure may include a second work function control portion on the first work function control portion. The second work function control portion may be closer, than the first work function control portion, to the first and second source/drain regions. The second work function control portion may include a metal alloy including a greater, relative to the first work function control portion, concentration of implanted and/or diffused metal atoms.

A semiconductor device, according to some embodiments, may include a substrate. The semiconductor device may include a source/drain region in the substrate. The semiconductor device may include a bit line on the source/drain region. Moreover, the semiconductor device may include a buried gate structure in the substrate. The buried gate structure may include a liner including first and second portions. The second portion of the liner may be closer, than the first portion, to the source/drain region. The second portion of the liner may include a first concentration of implanted and/or diffused metal atoms that is greater than a second concentration of the metal atoms in the first portion. Moreover, the buried gate structure may include a gate electrode that is adjacent a sidewall of the second portion of the liner and that includes a lower resistivity than polysilicon.

A method of forming a semiconductor device, according to some embodiments, may include forming a recess in a semiconductor substrate. The method may include forming a first metal layer in the recess. The method may include forming a second metal layer between opposing sidewalls of a lower portion of the first metal layer in the recess. Moreover, the method may include forming a metal alloy in an upper portion of the first metal layer in the recess. More of the metal alloy may be in the upper portion of the first metal layer than in the lower portion of the first metal layer.

A method of forming a semiconductor device, according to some embodiments, may include forming a recess in a semiconductor substrate. The method may include forming a first metal layer in the recess. The method may include forming a second metal layer between opposing sidewalls of a lower portion of the first metal layer in the recess. The method may include forming a metal alloy in an upper portion of the first metal layer in the recess. More of the metal alloy may be in the upper portion of the first metal layer than in the lower portion of the first metal layer. Moreover, the method may include forming a source/drain region in the semiconductor substrate, and forming a bit line structure on the source/drain region.

A method of forming a semiconductor device, according to some embodiments, may include forming a recess in a semiconductor substrate. The method may include forming a first metal layer in the recess. The method may include forming a second metal layer between opposing sidewalls of a lower portion of the first metal layer in the recess. The lower portion of the first metal layer may include a first work function control portion. The method may include forming a second work function control portion by forming a metal alloy in an upper portion of the first metal layer in the recess. More of the metal alloy may be in the second work function control portion than in the first work function control portion. Moreover, the method may include forming a source/drain region in the semiconductor substrate, and forming a bit line structure on the source/drain region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
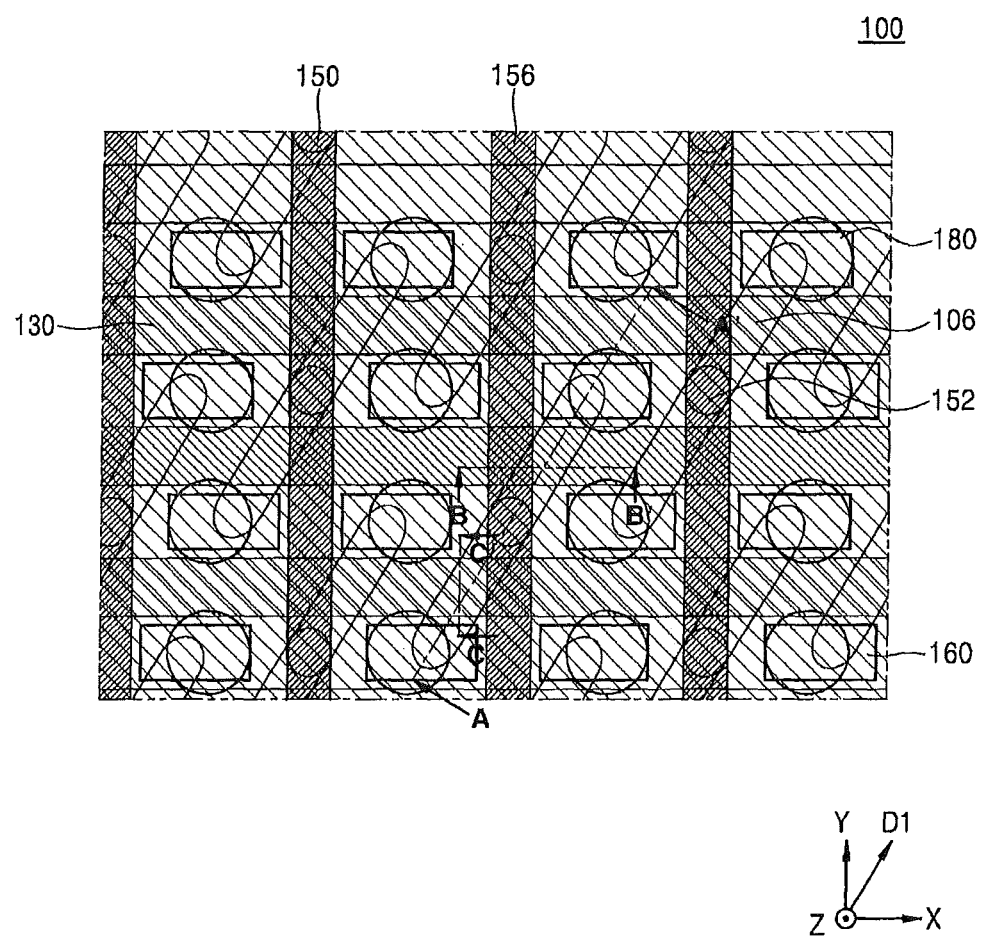
FIG. 1 is a schematic plan layout of a semiconductor device according to some embodiments.

FIG. 1 is a schematic plan layout of a semiconductor device 100 according to some embodiments.

Figure 2:
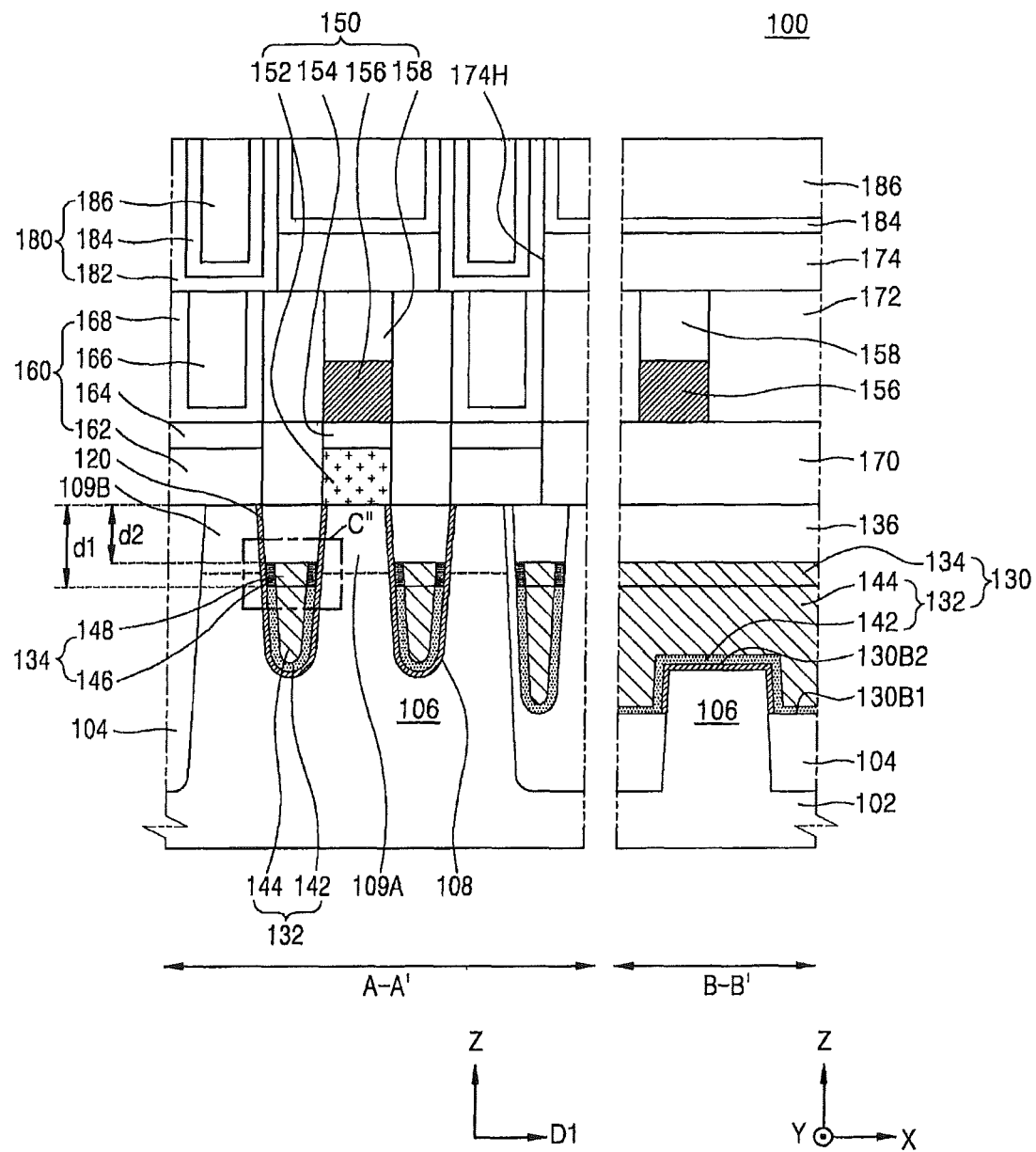
FIG. 2 is a cross-sectional view taken along lines A-A' and B-B' of FIG. 1.
Figure 3:
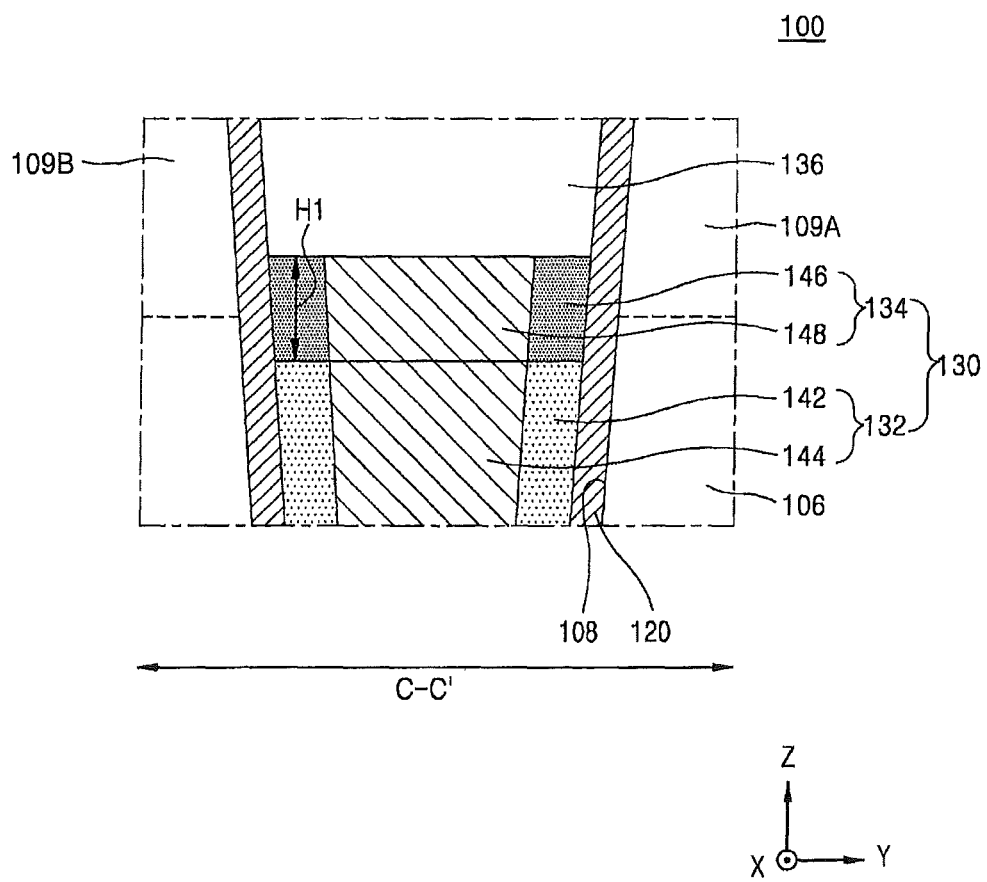
FIG. 3 is an enlarged cross-sectional view taken along a line C-C' of FIG. 1.

FIG. 2 is a cross-sectional view taken along lines A-A' and B-B' of FIG. 1, and FIG. 3 is an enlarged cross-sectional view taken along a line C-C' of FIG. 1. FIG. 3 illustrates an X-direction cross-sectional view corresponding to a portion C'' of FIG. 2.

Referring to FIGS. 1 to 3, a substrate 102 may include an active region 106 defined by an isolation layer 104.

The substrate 102 may include silicon (Si), for example, crystalline silicon, polycrystalline silicon (poly-Si), or amorphous silicon. In some embodiments, the substrate 102 may include a semiconductor material, such as germanium (Ge), silicon germanium (SiGe), silicon carbide (SiC), gallium arsenide (GaAs), indium arsenide (InAs), or indium phosphide (InP). In some embodiments, the substrate 102 may include a conductive region, for example, a doped well or a doped structure.

The isolation layer 104 may have a shallow trench isolation (STI) structure. For example, the isolation layer 104 may include an insulating material, which fills a device isolation trench (refer to 104T in FIG. 18A) formed in the substrate 102. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but present inventive concepts are not limited thereto.

The active region 106 may have a relatively elongated island shape having a minor axis and a major axis. As shown in FIG. 1, the major axis of the active region 106 may be arranged in a direction D1 parallel to a top surface of the substrate 102. In some embodiments, the active region 106 may have a first conductivity type. The first conductivity type may be a P type or an N type.

The substrate 102 may further include a trench 108, which may extend in a first direction (e.g., X direction in FIG. 1) parallel to the top surface of the substrate 102. The trench 108 may intersect the active region 106 and be formed to a predetermined depth from the top surface of the substrate 102. A portion of the trench 108 may extend into the isolation layer 104, and a portion of the trench 108 formed in the isolation layer 104 may have a bottom surface located at a lower level than a portion of the trench 108 formed in the active region 106. The term "recess," as used herein, may refer to the trench 108.

A first source/drain region 109A and a second source/drain region 109B may be located in an upper portion of the active region 106 on both sides of the trench 108. The first source/drain region 109A and the second source/drain region 109B may be impurity regions doped with impurities of a second conductivity type that is different from the first conductivity type. The second conductivity type may be an N type or a P type. The first source/drain region 109A and/or the second source/drain region 109B may, in some embodiments, be a non-elevated source/drain region (e.g., may not be elevated beyond an opening of the trench 108). A height/position of the first source/drain region 109A and/or the second source/drain region 109B, however, may be adjusted/modified. For example, in some embodiments, a lowermost surface of the first source/drain region 109A and/or the second source/drain region 109B may be higher than an uppermost surface of the gate structure 130. Alternatively, the lowermost surface of the first source/drain region 109A and/or the second source/drain region 109B may be lower than the uppermost surface of the gate structure 130.

A gate insulating layer 120 may be formed on an inner wall of the trench 108. The gate insulating layer 120 may be conformally formed on the inner wall of the trench 108 to a predetermined thickness. The gate insulating layer 120 may include at least one of silicon oxide, silicon nitride, silicon oxynitride, or a high-k dielectric material having a higher dielectric constant than that of silicon oxide. The high-k dielectric material may include, for example, a metal oxide or a metal oxynitride, such as hafnium oxide, hafnium oxynitride, or hafnium silicon oxide. However, a material included in the gate insulating layer 120 is not limited thereto. For example, when the gate insulating layer 120 includes silicon oxide, the gate insulating layer 120 may include silicon oxide that is formed on an exposed surface of the substrate 102 by using a thermal oxidation process. Alternatively, in some embodiments, the gate insulating layer 120 may include silicon oxide, silicon nitride, silicon oxynitride, or a high-k dielectric material, which is deposited by using a low-pressure chemical vapor deposition (LPCVD) process, a plasma-enhanced CVD (PECVD) process, an ultra-high vacuum CVD (UHV-CVD) process, or an atomic layer deposition (ALD) process.

A gate structure 130 and a gate capping layer 136 may be sequentially disposed on the gate insulating layer 120 within the trench 108. The gate structure 130 may fill a portion of the trench 108 to a predetermined height from a bottom portion of the trench 108, while the gate capping layer 136 on the gate structure 130 may fill the remaining portion of the trench 108. The gate structure 130 may be a buried gate structure in the substrate 102.

As shown in FIG. 2, the bottom surface of the portion of the trench 108 formed in the isolation layer 104 may be at a lower level than the portion of the trench 108 formed in the active region 106. Thus, a bottom surface 130B1 of the gate structure 130 formed in the isolation layer 104 may be located at a lower level than a bottom surface 130B2 of the gate structure 130 formed in the active region 106. For example, the gate structure 130 may have a non-planar, saddle-type structure, but present inventive concepts are not limited thereto.

The gate structure 130 may include a lower gate electrode 132 filling the bottom portion of the trench 108 and an upper gate electrode 134 on the lower gate electrode 132. The gate capping layer 136 may be formed on the gate structure 130 and fill the remaining portion of the trench 108. Here, terms "lower" and "upper" gate electrodes 132 and 134 may be interpreted as a portion of the gate structure 130 that is spaced a relatively large vertical distance apart from an uppermost surface of the substrate 102, and a portion of the gate structure 130 that is spaced a relatively small vertical distance apart from the uppermost surface of the substrate 102, respectively. For example, as shown in FIG. 2, a vertical distance d1 between a top surface of the lower gate electrode 132 and the uppermost surface of the substrate 102 may be greater than a vertical distance d2 between the top surface of the upper gate electrode 134 and the uppermost surface of the substrate 102.

The lower gate electrode 132 may have a predetermined height from a lowermost surface of the trench 108 and fill the bottom portion of the trench 108. The lower gate electrode 132 may include a lower work-function control layer 142 conformally formed on the gate insulating layer 120 in the bottom portion of the trench 108, and a lower filling metal layer 144 formed on the lower work-function control layer 142 to fill the bottom portion of the trench 108.

In some embodiments, the lower work-function control layer 142 may include a metal, a metal nitride, or a metal carbide, such as titanium (Ti), titanium nitride (TiN), titanium aluminum nitride (TiAlN), titanium aluminum carbide (TiAlC), titanium aluminum carbonitride (TiAlCN), titanium silicon carbonitride (TiSiCN), tantalum (Ta), tantalum nitride (TaN), tantalum aluminum nitride (TaAlN), tantalum aluminum carbonitride (TaAlCN), or tantalum silicon carbonitride (TaSiCN). The lower work-function control layer 142 may be a single layer including one of the above-described materials or a stacked structure of at least two materials thereof, but present inventive concepts are not limited thereto. In some embodiments, the lower work-function control layer 142 may have a thickness of about 10 Angstroms (Å) to about 50 Å. The lower work-function control layer 142 may be formed by using an ALD process, a metal organic ALD (MOALD) process, or a metal organic chemical vapor deposition (MOCVD) process.

In some embodiments, the lower filling metal layer 144 may include at least one of tungsten (W), tungsten nitride (WN), TiN, and TaN. However, a material included in the lower filling metal layer 144 is not limited thereto. The lower filling metal layer 144 may include a material having good gap-filling characteristics and a relatively low resistivity. A height of the lower filling metal layer 144 may range from about 50% to about 90% of the total height of the gate structure 130. For example, since the height of the lower filling metal layer 144 ranges from about 50% to about 90% of the total height of the gate structure 130, a resistance of the gate structure 130 may be reduced.

The upper gate electrode 134 may fill a portion of the trench 108 at a higher level than the lower gate electrode 132. The upper gate electrode 134 may include an upper work-function control layer 146 conformally formed on an inner wall of the trench 108 and an upper filling metal layer 148 formed on the lower filling metal layer 144. A depth, in the trench 108, of an uppermost surface of the upper work-function control layer 146 may be 610 Angstroms or fewer. The lower work-function control layer 142 and the upper work-function control layer 146 may be respective portions of a metal liner in the trench 108. The upper work-function control layer 146 may be the smaller one of the portions of the metal liner. For example, the upper work-function control layer 146 may have a smaller volume and/or cross-sectional area in the trench 108 than the lower work-function control layer 142.

The upper work-function control layer 146 may include a metal, a metal nitride, or a metal carbide, which may include/contain a work-function controlling metal material. For example, the upper work-function control layer 146 may include a metal, a metal nitride, or a metal carbide, such as Ti, TiN, TiAlN, TiAlC, TiAlCN, TiSiCN, Ta, TaN, TaAlN, TaAlCN, and TaSiCN. The upper work-function control layer 146 may be a single layer including one of the above-described materials or a stacked structure of at least two materials thereof, but present inventive concepts are not limited thereto.

In some embodiments, the upper work-function control layer 146 may have a thickness of about 10 Å to about 50 Å. The upper work-function control layer 146 may have a first height H1 in a direction (Z direction) perpendicular to the top surface of the substrate 102, and the first height H1 may range from about 2 Å to about 50 Å. However, the first height H1 of the upper work-function control layer 146 is not limited thereto. For example, the first height H1, which may be referred to herein as a "vertical thickness," in the trench 108, of the upper work-function control layer 146, may range from 2 Angstroms to 300 Angstroms. In some embodiments, the vertical thickness/first height H1 may be between 200 Angstroms and 300 Angstroms.

The work-function controlling metal material may include, for example, at least one of lanthanum (La), strontium (Sr), antimony (Sb), yttrium (Y), aluminum (Al), tantalum (Ta), hafnium (Hf), or iridium (Ir). However, a kind (e.g., a type/element) of the work-function controlling metal material is not limited thereto. The work-function controlling metal material may include a metal material that may uniformly diffuse into the upper work-function control layer 146. Also, the work-function controlling metal material may include a metal material capable of reducing an effective work function of the above-described metal, metal nitride, or metal carbide included in the upper work-function control layer 146.

In some embodiments, when the active region 106 is an NMOS active region, the work-function controlling metal material may be/include at least one of lanthanum (La), strontium (Sr), antimony (Sb), or yttrium (Y). Alternatively, when the active region 106 is a PMOS active region, the work-function controlling metal material may include at least one of aluminum (Al), tantalum (Ta), hafnium (Hf), or iridium (Ir).

In some embodiments, the upper work-function control layer 146 may include the work-function controlling metal material at a first content. The term "content," as used herein, may refer to a concentration. The first content (e.g., concentration) may range from about 0.01 atomic percent (at %) to about 10 at %, but is not limited thereto. For example, when the upper work-function control layer 146 includes a TiN material layer including lanthanum (La), lanthanum atoms may be substantially and uniformly distributed in the TiN material layer. Alternatively, lanthanum atoms may be distributed with a gradient in its concentration profile in the TiN material layer. For example, in the upper work-function control layer 146, the first content may vary according to a vertical direction (Z direction) and/or a horizontal direction (Y direction). Also, a work function of the TiN material layer including lanthanum may vary depending on the content (e.g., concentration) of lanthanum included/contained in the TiN material layer. For example, the TiN material layer may have a work function of about 4.5 eV. As the content (e.g., concentration) of lanthanum included/contained in the TiN material layer increases, a work function of the TiN material layer including lanthanum may be reduced. For example, when the content (i.e., the first content/concentration) of lanthanum ranges from about 0.01 at % to about 10 at %, the work function of the portion of the TiN material layer including lanthanum may be about 0.01 eV to about 1 eV less than the work function of the portion of the TiN material layer that is substantially free of lanthanum (e.g., that includes a concentration of less than 0.01 percent lanthanum). As an example, the TiN material layer having the work function of about 4.5 eV may have the work function reduced to about 4.1 eV by using lanthanum oxide in the TiN material layer.

The work-function controlling metal material in the upper work-function control layer 146 may provide a metal alloy. For example, a combination in the upper work-function control layer 146 of TiN with La atoms may be referred to as a metal alloy. The words "metal alloy," as used herein, refer to a combination/mixture of metals and do not require a melting of the metals. The metal alloy is formed by implantation and/or diffusion of metal atoms. More of the metal alloy is in the upper work-function control layer 146 than in the lower work-function control layer 142. For example, a majority of implanted and/or diffused metal atoms (e.g., La atoms) are in the upper work-function control layer 146, rather than in the lower work-function control layer 142. As an example, a concentration of La atoms in the lower work-function control layer 142 may be less than 0.01 percent, whereas a concentration of La atoms in the upper work-function control layer 146 may be greater than or equal to 0.01 percent. In some embodiments, the metal alloy in the upper work-function control layer 146 may include titanium nitride and lanthanum oxide.

Since the work-function controlling metal material is included in the upper work-function control layer 146 at the first content (e.g., concentration), a work function of the upper work-function control layer 146 may be less than a work function of the lower work-function control layer 142. For example, the work function of the upper work-function control layer 146 may be about 0.01 eV to about 1 eV less than the work function of the lower work-function control layer 142, but is not limited thereto.

In general, as a size of the gate structure 130 decreases, a distance between the gate structure 130 and the first and second source/drain regions 109A and 109B may also decrease. Thus, a gate-induced drain leakage (GIDL) current may be generated due to a high electric field applied between the gate structure 130 and the first and second source/drain regions 109A and 109B. However, since the upper gate electrode 134 located near the first and second source/drain regions 109A and 109B includes a material having a relatively small work function, application of a high electric field between the gate structure 130 and the first and second source/drain regions 109A and 109B may be reduced/prevented. As a result, the GIDL may be reduced. A work function of the gate structure 130 and a GIDL will be described in detail later with reference to FIGS. 4A and 4B.

In some embodiments, the upper work-function control layer 146 may be formed integrally with the lower work-function control layer 142. For example, in a process of forming the lower and upper work-function control layers 142 and 146 according to some embodiments, after the preliminary work-function control layer (refer to 140 in FIG. 18B) is formed on the inner wall of the trench 108, a work-function controlling metal material may be diffused into an upper portion of the preliminary work-function control layer 140 only to a predetermined height. Thus, the upper work-function control layer 146 containing the work-function controlling metal material at the first content (e.g., concentration) may be formed in the upper portion of the preliminary work-function control layer 140, while the remaining portion of the preliminary work-function control layer 140 may remain as the lower work-function control layer 142.

Meanwhile, a portion of the gate insulating layer 120 may be between the upper work-function control layer 146 and the inner wall of the trench 108.

The upper filling metal layer 148 may be formed on the upper work-function control layer 146 at a higher level than the lower filling metal layer 144. An interface of the upper filling metal layer 148 and the lower filling metal layer 144 may include oxide. In some embodiments, methods described herein may include removing the oxide from the interface of the upper filling metal layer 148 and the lower filling metal layer 144.

A top surface of the upper filling metal layer 148 may be at substantially the same level as (e.g., coplanar with) a top surface of the upper work-function control layer 146. A material included in the upper filling metal layer 148 may have similar properties to those of a material included in the lower filling metal layer 144. The upper filling metal layer 148 may not include the work-function controlling metal material.

In some embodiments, the term "gate electrode," as used herein, may refer to the lower filling metal layer 144 and/or the upper filling metal layer 148. Moreover, references herein to a liner on sidewalls of a gate electrode may refer to the metal liner that includes the lower and upper work-function control layers 142, 146 being on sidewalls of the lower filling metal layer 144 and/or the upper filling metal layer 148.

A portion of the upper gate electrode 134 may be located at the same level as the first and second source/drain regions 109A and 109B. For example, an upper portion of the upper gate electrode 134 may be located at the same level as portions of (e.g., some of) bottom portions of the first and second source/drain regions 109A and 109B, but present inventive concepts are not limited thereto. FIG. 2 illustrates an example in which the first source/drain region 109A has a bottom surface located at the same level as a bottom surface of the second source/drain region 109B, but present inventive concepts are not limited thereto. For example, unlike the structure illustrated in FIG. 2, the first and second source/drain regions 109A and 109B may have different heights such that the bottom surface of any one of the first and second source/drain regions 109A and 109B is at a lower level than the bottom surface of the other thereof. For example, a portion of the upper gate electrode 134 may be located at the same level as a portion of the first source/drain region 109A, while the upper gate electrode 134 may not be located at the same level as the second source/drain region 109B.

The gate capping layer 136 on the gate structure 130 may fill the remaining portion of the trench 108. For example, the gate capping layer 136 may include at least one of silicon oxide, silicon oxynitride, and silicon nitride.

A bit line structure 150 may be formed on the first source/drain region 109A. The bit line structure 150 may extend in a second direction (Y direction in FIG. 1) that is parallel to a top surface of the substrate 102 and perpendicular to the first direction (X direction in FIG. 1). The bit line structure 150 may include a bit line contact 152, a bit line intermediate layer 154, a bit line 156, and a bit line capping layer 158, which are sequentially stacked on the substrate 102. For example, the bit line contact 152 may include polysilicon, and the bit line intermediate layer 154 may include a metal silicide (e.g., tungsten silicide) or a metal nitride (e.g., tungsten nitride). The bit line 156 may include a metal material. The bit line capping layer 158 may include an insulating material, such as silicon nitride or silicon oxynitride.

Optionally, bit line spacers may be further formed on sidewalls of the bit line structure 150. The bit line spacers may have a single structure or multi-layered structure including an insulating material, such as silicon oxide, silicon oxynitride, or silicon nitride. Also, the bit line spacers may further include air spaces (e.g., gaps).

A contact structure 160 may be formed on the second source/drain region 109B. The contact structure 160 may include a lower contact pattern 162, a metal silicide layer 164, and an upper contact pattern 166, which are sequentially stacked on the substrate 102, and a barrier layer 168 surrounding a side surface and a bottom surface of the upper contact pattern 166. In some embodiments, the lower contact pattern 162 may include polysilicon, and the upper contact pattern 166 may include a metal material. The barrier layer 168 may include a metal nitride having a particular conductivity type. However, a structure of the contact structure 160 shown in FIG. 2 is only an example, and present inventive concepts are not limited thereto. In some embodiments, a conductive pad may be further formed on the upper contact pattern 166 and the barrier layer 168.

First and second insulating interlayers 170 and 172 may be formed on the substrate 102 and surround a side surface of the bit line structure 150 and a side surface of the contact structure 160. The bit line contact 152 and the bit line intermediate layer 154 may penetrate through the first insulating interlayer 170, and the bit line 156 may be disposed on the first insulating interlayer 170. The second insulating interlayer 172 may be formed on the first insulating interlayer 172 to cover side surfaces of the bit line 156 and the bit line capping layer 158. The contact structure 160 may be connected to the second source/drain region 109B through the first and second insulating interlayers 170 and 172. A support layer 174 including an opening 174H exposing a top surface of the contact structure 160 may be formed on the second insulating interlayer 172.

An information storage unit 180 (which may be referred to as a "storage structure" or a "storage region") may be formed on the second insulating interlayer 172 and may be electrically connected to the contact structure 160. For example, the information storage unit 180 may be a cell capacitor of a dynamic random access memory (DRAM) device, a phase-change memory unit of a phase-change RAM (PRAM) device, a variable resistance memory unit of a resistive RAM (ReRAM) device, or a magnetic tunnel junction structure of a magnetic RAM (MRAM) device. For example, when the information storage unit 180 is a cell capacitor of a DRAM device, the information storage unit 180 may include a lower electrode 182 electrically connected to the contact structure 160, a capacitor dielectric layer 184 located on the lower electrode 182, and an upper electrode 186 located on the capacitor dielectric layer 184. Meanwhile, the support layer 174 may surround a portion of a side surface of the lower electrode 182.

Hereinafter, effective work functions of portions of the gate structure 130 will be described with reference to FIGS. 4A and 4B.

Figure 4A:
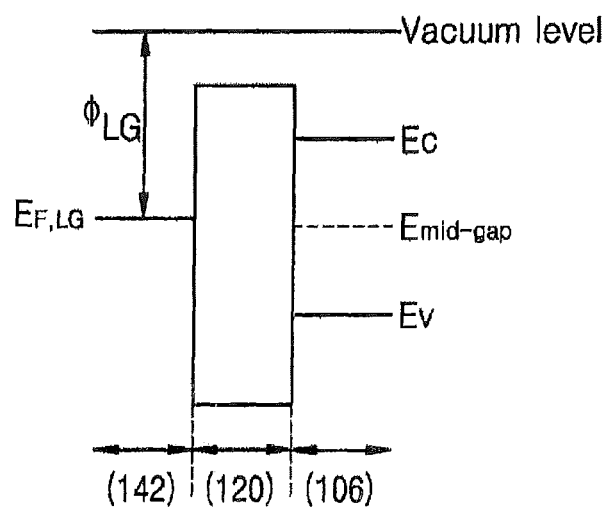
FIGS. 4A and 4B are schematic band diagrams of portions of gate structures and active regions adjacent thereto.

FIG. 4A is a schematic energy band diagram of the lower work-function control layer 142 of the lower gate electrode 132 and the active region 106 adjacent to the lower work-function control layer 142. FIG. 4B is a schematic energy band diagram of the upper work-function control layer 146 of the upper gate electrode 134 and the first and second source/drain regions 109A and 109B adjacent to the upper work-function control layer 146.

Referring to FIG. 4A, the lower work-function control layer 142 may have a Fermi energy level $E_{F,LG}$ that is similar to a level of mid-gap energy $E_{mid\text{-}gap}$ of the active region 106. In other words, the lower work-function control layer 142 may include a mid-gap conductive material. Here, the mid-gap conductive material may refer to a conductive material having an energy level similar to a mid-gap energy $E_{mid\text{-}gap}$ of/between a conduction band Ec or a valence band Ev in an energy band diagram of the active region 106. Also, the mid-gap energy $E_{mid\text{-}gap}$ may refer to a middle value of/between the conduction band Ec or the valance band Ev in the energy band diagram of the active region 106. For example, the lower work-function control layer 142 may include a metal, a metal nitride, or a metal carbide, such as Ti, TiN, TiAlN, TiAlC, TiAlCN, TiSiCN, Ta, TaN, TaAlN, TaAlCN, TaSiCN, which may be the mid-gap conductive material.

Figure 4B:
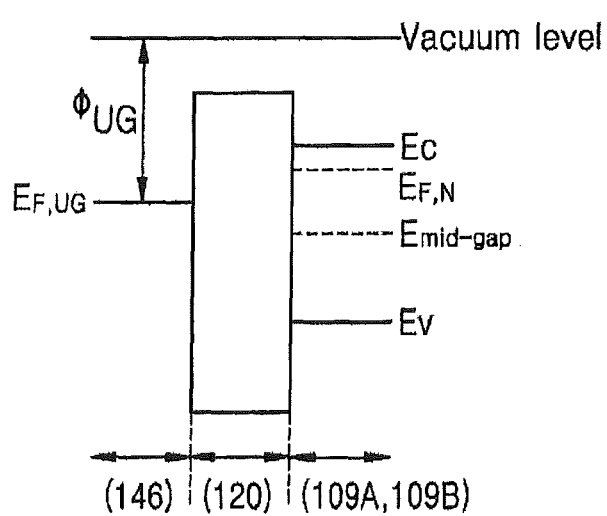

Referring to FIG. 4B, a Fermi energy level $E_{F,UG}$ of the upper work-function control layer 146 may be closer to the conduction band Ec of the active region 106 than the Fermi energy level $E_{F,LG}$ of the lower work-function control layer 142, due to the fact that the upper work-function control layer 146 includes a mid-gap conductive material including/containing a work-function controlling metal material at a predetermined concentration/content. For example, when the work-function controlling metal material includes at least one of lanthanum (La), strontium (Sr), antimony (Sb), or yttrium (Y), the work-function controlling metal material may be diffused and distributed in the upper work-function control layer 146. Also, due to the work-function controlling metal material, the upper work-function control layer 146 may have a Fermi energy level $E_{F,UG}$ closer to the conduction band Ec of the active region 106, compared to the case of the Fermi energy level $E_{F,LG}$ of the lower work-function control layer 142.

FIG. 4B illustrates a Fermi energy level $E_{F,N}$ of the first and second source/drain regions 109A and 109B when the active region 106 is an NMOS active region. The first and second source/drain regions 109A and 109B doped with N-type impurities may have a Fermi energy level $E_{F,N}$ that is close to the conduction band Ec of the active region 106.

As can be seen from FIGS. 4A and 4B, the Fermi energy level $E_{F,UG}$ of the upper work-function control layer 146 may be closer to the Fermi energy level $E_{F,N}$ of the first and second source/drain regions 109A and 109B of the active region 106, compared to the case of the Fermi energy level $E_{F,LG}$ of the lower work-function control layer 142.

For instance, when the active region 106 is an NMOS active region, the work-function controlling metal material may be a metal material having a Fermi energy level higher than a mid-gap energy $E_{mid\text{-}gap}$. In other words, the work-function controlling metal material may be a metal material having a smaller work function than a mid-gap conductive material. That is, since the work-function controlling metal material is included in the upper work-function control layer 146, an effective work function $\Phi_{LG}$ of the upper work-function control layer 146 may be less than an effective work function $\Phi_{LG}$ of the lower work-function control layer 142.

Since the effective work function $\Phi_{UG}$ of the upper work-function control layer 146 is less than the effective work function $\Phi_{LG}$ of the lower work-function control layer 142 (for example, since a level difference (i.e., $\Delta E = E_{F,N} - E_{F,UG}$) between the Fermi energy level $E_{F,UG}$ of the upper work-function control layer 146 and the Fermi energy level $E_{F,N}$ of the first and second source/drain regions 109A and 109B is smaller than a level difference (i.e., $\Delta E = E_{F,N} - E_{F,LG}$) between the Fermi energy level $E_{F,LG}$ of the lower work-function control layer 142 and the Fermi energy level $E_{F,N}$ of the first and second source/drain regions 109A and 109B), an electric field that may be applied between the first and second source/drain regions 109A and 109B and the upper work-function control layer 146 may be lower than an electric field that may be applied between the first and second source/drain regions 109A and 109B and the lower work-function control layer 142. Accordingly, a GIDL induced to the first and second source/drain regions 109A and 109B due to the upper work-function control layer 146 may be lower than a GIDL induced to the first and second source/drain regions 109A and 109B due to the lower work-function control layer 142. If, on the other hand, the lower work-function control layer 142 and the upper work-function control layer 146 included equal concentrations of a work-function controlling material (e.g., lanthanum oxide), then a GIDL problem could persist in the first and second source/drain regions 109A and 109B.

If the gate structure 130 includes a metal material including a mid-gap conductive material over the entire height thereof, a relatively high electric field may be applied between the gate structure 130 and the first and second source/drain regions 109A and 109B in a similar manner to the case described with reference to FIG. 4A, so that a considerable amount of GIDL may be generated. However, if the upper work-function control layer 146 having a relatively small effective work function is formed in an upper portion of the gate structure 130, an electric field applied between the gate structure 130 and the first and second source/drain regions 109A and 109B may be reduced, so that a GIDL may be markedly reduced. If, on the other hand, the GIDL were not reduced, then a DRAM refresh time could be undesirably delayed. Accordingly, various embodiments of present inventive concepts may both (i) reduce GIDL and (ii) increase a DRAM refresh speed, by providing a metal alloy (e.g., lanthanum and titanium nitride) in an upper portion of a liner.

Referring back to FIGS. 1 to 3, in the semiconductor device 100, the gate structure 130 may have the stack structure of the lower gate electrode 132 and the upper gate electrode 134, and a work-function controlling metal material may be included/contained at a predetermined concentration/content in the upper work-function control layer 146 of the upper gate electrode 134. Thus, an effective work function of the upper gate electrode 134 may be less than an effective work function of the lower gate electrode 132. Also, since the upper gate electrode 134 formed adjacent to the first and second source/drain regions 109A and 109B has a relatively small effective work function (or has a smaller effective work function than the lower gate electrode 132), a GIDL caused by a high electric field may be reduced.

Furthermore, in a comparative case in which an upper gate electrode includes, for example, an n$^+$-doped poly-Si material so as to reduce a GIDL, since a poly-Si material has a relatively high resistivity and poor gap-filling characteristics, a gate structure including the poly-Si material may have a relatively high resistance. However, in the above-described semiconductor device 100, the upper gate electrode 134 may include the upper work-function control layer 146 and the upper filling metal layer 148, and the upper filling metal layer 148 may have a lower resistivity and better gap-filling characteristics than poly-Si. Accordingly, the gate structure 130 may have a low resistance.

In conclusion, the above-described semiconductor device 100 may include the gate structure 130 having a low resistance and also, have a reduced GIDL. Accordingly, the semiconductor device 100 may have good electrical performance.

Figure 5:
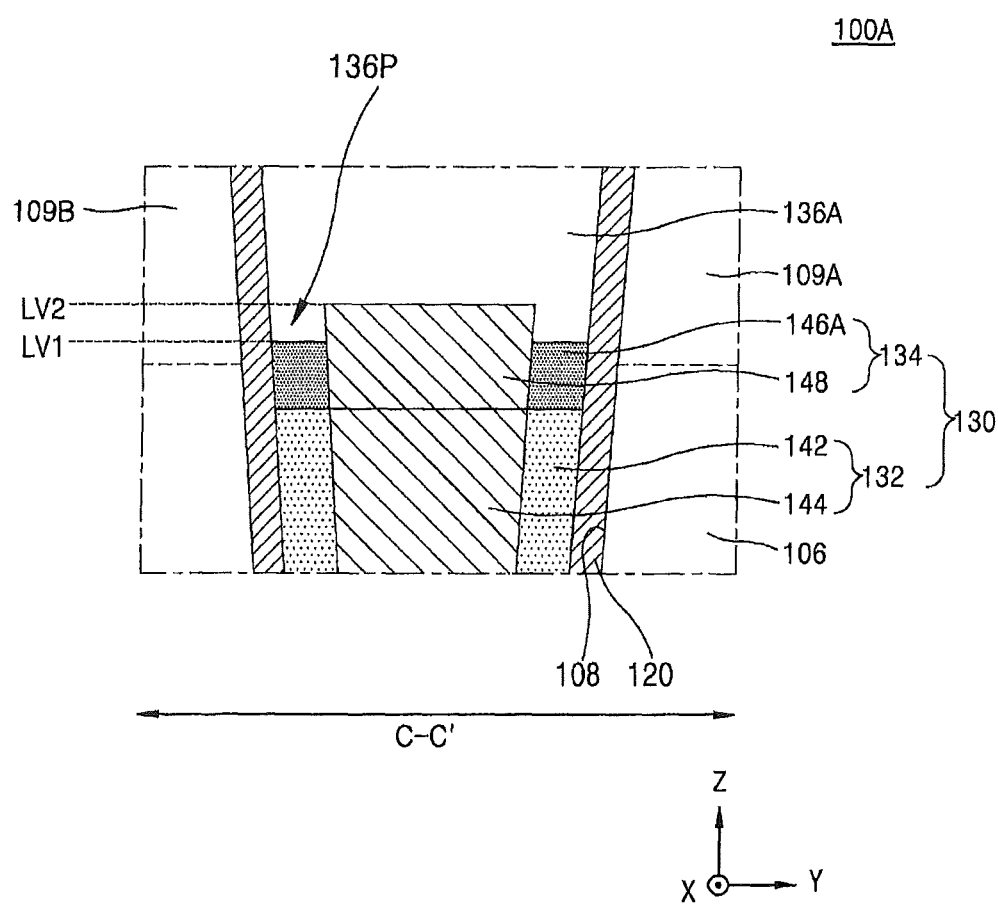
FIG. 5 is a cross-sectional view of a semiconductor device according to some embodiments.

FIG. 5 is a cross-sectional view of a semiconductor device 100A according to some embodiments. FIG. 5 is an enlarged cross-sectional view corresponding to a line C-C' of FIG. 1. In FIG. 5, the same reference numerals are used to denote the same elements as in FIGS. 1 to 4.

Referring to FIG. 5, a top level LV1 of an upper work-function control layer 146A may be lower than a top level LV2 of an upper filling metal layer 148. A portion of a gate capping layer 136A may extend to a top surface of the upper work-function control layer 146A between a gate insulating layer 120 and the upper filling metal layer 148. For example, the gate capping layer 136A may include an insulating material having good gap-fill characteristics, and a protrusion 136P of the gate capping layer 136A may be in contact with the upper work-function control layer 146A between the gate insulating layer 120 and the upper filling metal layer 148.

Since the top level LV1 of the upper work-function control layer 146A is lower than the top level LV2 of the upper filling metal layer 148, a sufficient distance may be ensured between an edge portion of the upper gate electrode 134 and the bit line contact (refer to 152 in FIG. 2), and occurrence of an electrical short may be impeded/prevented during the formation of the bit line structure (refer to 150 in FIG. 2).

In a process of forming the upper gate electrode 134 according to some embodiments, after the upper work-function control layer 146A and the upper filling metal layer 148 are formed to fill the inside of the trench 108, upper portions of the upper work-function control layer 146A and the upper filling metal layer 148 may be removed by using an etchback process. During the etchback process, portions of the upper work-function control layer 146A and the upper filling metal layer 148 may be removed at different etch rates. In this case, a top level LV1 of the upper work-function control layer 146A may be lower than a top level LV2 of the upper filling metal layer 148. However, present inventive concepts are not limited thereto. In some embodiments, after portions of the upper work-function control layer 146A and the upper filling metal layer 148 are removed at similar etch rates during the etchback process such that the top level LV1 of the upper work-function control layer 146A is the same as the top level LV2 of the upper filling metal layer 148, an additional etching process for removing an upper portion of the upper work-function control layer 146A to a predetermined height may be further performed.

Figure 6:
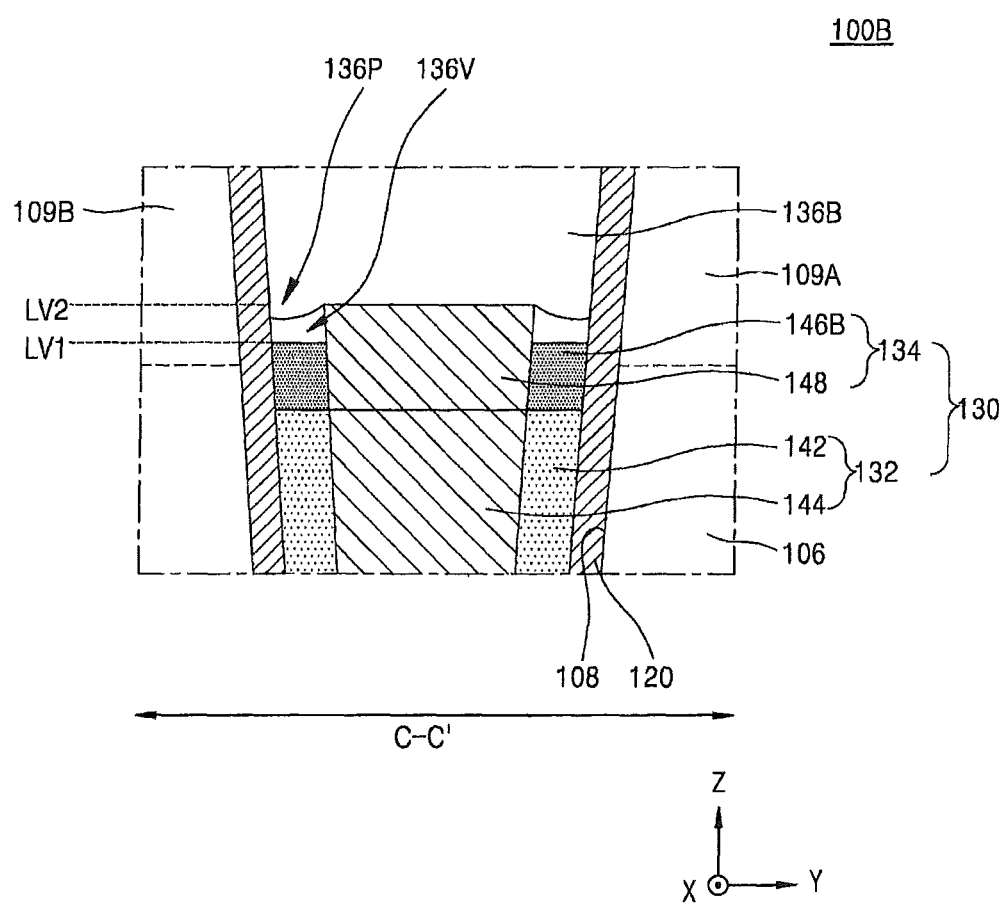
FIG. 6 is a cross-sectional view of a semiconductor device according to some embodiments.

FIG. 6 is a cross-sectional view of a semiconductor device 100B according to some embodiments. FIG. 6 is an enlarged cross-sectional view corresponding to the line C-C' of FIG. 1. In FIG. 6, the same reference numerals are used to denote the same elements as in FIGS. 1 to 5.

Referring to FIG. 6, a top level LV1 of an upper work-function control layer 146B may be lower than a top level LV2 of an upper filling metal layer 148, and a void 136V may be formed between a gate insulating layer 120 and the upper filling metal layer 148.

Although a protrusion 136P of a gate capping layer 136B may be located between the gate insulating layer 120 and the upper filling metal layer 148, the protrusion 136P of the gate capping layer 136B may not be in contact with a top surface of the upper work-function control layer 146B. However, present inventive concepts are not limited thereto. A portion of the top surface of the upper work-function control layer 146B located between the gate insulating layer 120 and the upper filling metal layer 148 may, in some embodiments, be in contact with the protrusion 136P of the gate capping layer 136B, and another portion of the top surface of the upper work-function control layer 146B may be exposed by the void 136V.

For instance, the gate capping layer 136B may include an insulating material having relatively poor gap-fill characteristics. Thus, a space between the gate insulating layer 120 and the upper filling metal layer 148 may not be completely filled with the gate capping layer 136B, so that the void 136V may be formed.

Figure 7:
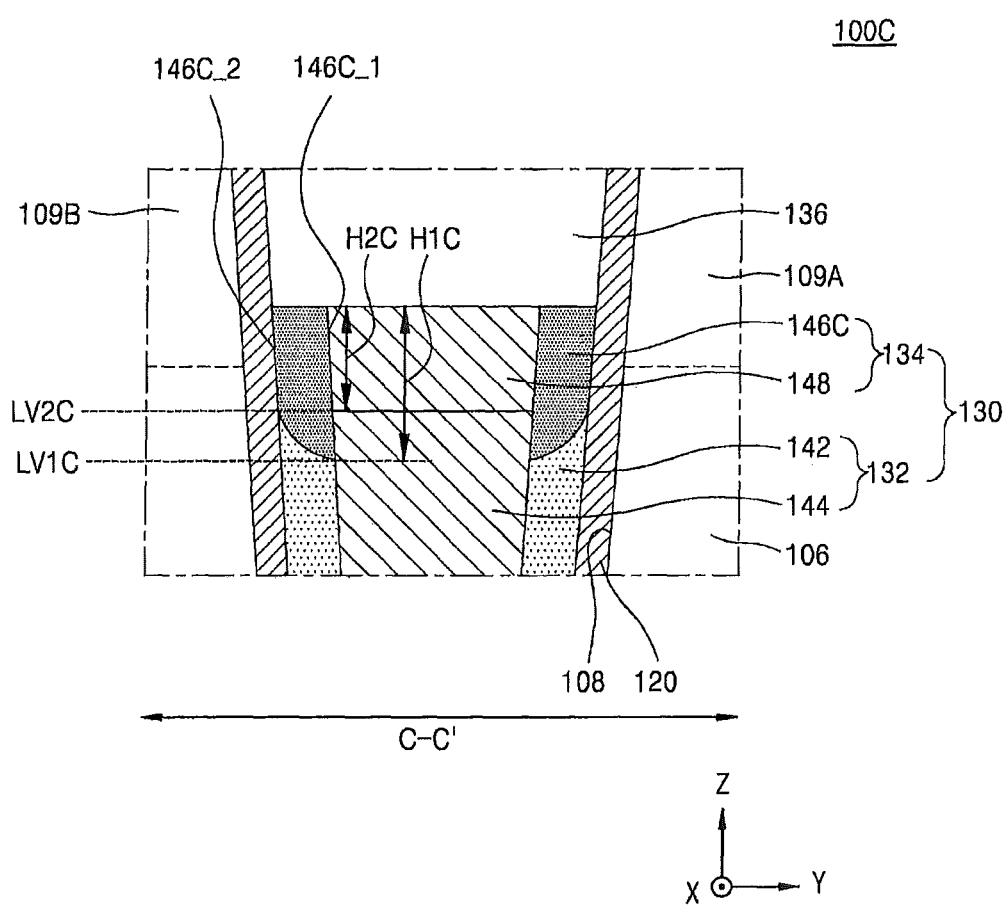
FIG. 7 is a cross-sectional view of a semiconductor device according to some embodiments.

FIG. 7 is a cross-sectional view of a semiconductor device 100C according to some embodiments. FIG. 7 is an enlarged cross-sectional view corresponding to the line C-C' of FIG. 1. In FIG. 7, the same reference numerals are used to denote the same elements as in FIGS. 1 to 6.

Referring to FIG. 7, a bottom surface of an upper work-function control layer 146C may be inclined at a predetermined inclination angle with respect to a top surface of a substrate 102. That is, a level of the bottom surface of the upper work-function control layer 146C may decrease away from an inner wall of a trench 108 in a second direction (Y direction) that is parallel to the top surface of the substrate 102 and perpendicular to a first direction (X direction).

The upper work-function control layer 146C may include a first side surface 146C_1 and a second side surface 146C_2. The first side surface 146C_1 may be in contact with an upper filling metal layer 148 and a portion of a lower filling metal layer 144, and the second side surface 146C_2 may be in contact with a gate insulating layer 120. The first side surface 146C_1 may have a first height H1C in a third direction (Z direction) perpendicular to the top surface of the substrate 102, while the second side surface 146C_2 may have a second height H2C in the third direction. The first height H1C may be greater than the second height H2C. Also, a lowermost level LV1C of the upper work-function control layer 146C may be lower than a bottom level LV2C of the upper filling metal layer 148.

FIG. 7 illustrates an example in which the bottom surface of the upper work-function control layer 146C has a downwardly protruding profile, but present inventive concepts are not limited thereto. For example, the bottom surface of the upper work-function control layer 146C may have a sectional shape including a plurality of stepped portions toward the second side surface 146C_2 and away from the first side surface 146C_1 (i.e., in a direction toward the gate insulating layer 120).

In a process of forming an upper gate electrode 134 according to some embodiments, after a preliminary work-function control layer (refer to 140 in FIG. 19) is conformally formed on the inner wall of the trench 108, a lower filling metal layer 144 may be formed to fill a bottom portion of the trench 108. Thereafter, ions of a work-function controlling metal material may be implanted into a portion of the preliminary work-function control layer, which is exposed in the trench 108 at a higher level than the lower filling metal layer 144. For example, when the work-function controlling metal material is implanted and/or diffused into the portion of the preliminary work-function control layer by using an oblique ion implantation process, the work-function controlling metal material may be implanted and/or diffused even to a portion of the preliminary work-function control layer, which is located at a lower level than the top surface of the lower filling metal layer 144. Thus, an upper work-function control layer 146C having an inclined bottom surface may be formed as shown in FIG. 7. As used herein, the term "and/or" includes any and all combinations of one or more of the associated listed items.

In a process of forming the upper gate electrode 134 according to some embodiments, after a preliminary work-function control layer (refer to 140 in FIG. 18B) is conformally formed on the inner wall of the trench 108, a lower filling metal layer 144 may be formed to fill the bottom portion of the trench 108. A metal-containing liner (refer to 149 in FIG. 18D) may be formed on a portion of the preliminary work-function control layer, which is exposed within the trench 108 at a higher level than the lower filling metal layer 144. The metal-containing liner may include a work-function controlling metal material. The work-function controlling metal material may be diffused from the metal-containing liner into the preliminary work-function control layer, thereby forming the upper work-function control layer 146C. The work-function controlling metal material included in the metal-containing liner may be diffused by a predetermined distance in a horizontal direction and/or a vertical direction. The work-function controlling metal material may diffuse to a level (e.g., the lowermost level LV1C of the upper work-function control layer 146C) that is lower than the top surface of the lower filling metal layer 144. Thus, the upper work-function control layer 146C including the inclined bottom surface may be formed as shown in FIG. 7.

Figure 8:
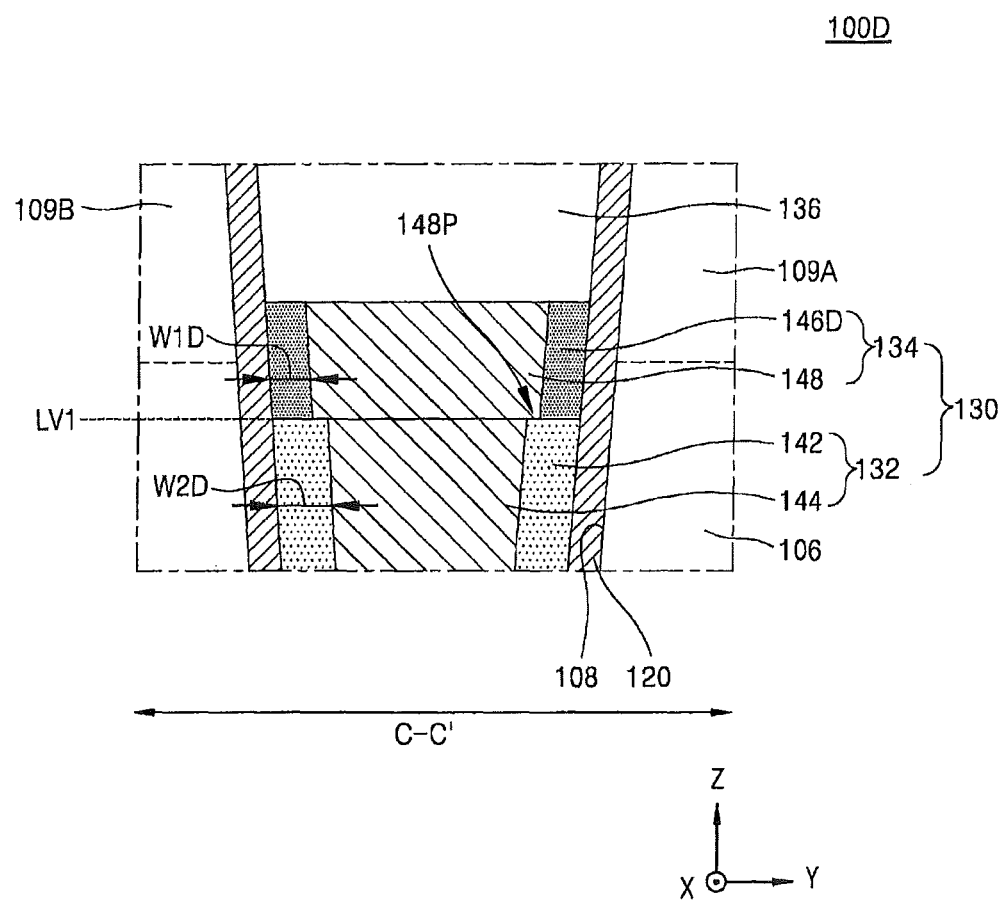
FIG. 8 is a cross-sectional view of a semiconductor device according to some embodiments.

FIG. 8 is a cross-sectional view of a semiconductor device 100D according to some embodiments. FIG. 8 is an enlarged cross-sectional view corresponding to the line C-C' of FIG. 1. In FIG. 8, the same reference numerals are used to denote the same elements as in FIGS. 1 to 7.

Referring to FIG. 8, an upper work-function control layer 146D may have a first width W1D in a second direction (Y direction), and the first width W1D may be less than a second width W2D of a lower work-function control layer 142 in the second direction (Y direction). An upper filling metal layer 148 in contact with the upper work-function control layer 146D may include a protrusion 148P, which may protrude from an interface between the upper work-function control layer 146D and the lower work-function control layer 142 in a horizontal direction (second direction). As shown in FIG. 8, a bottom surface of the protrusion 148P of the upper filling metal layer 148 may be at substantially the same level as a bottom surface of the upper work-function control layer 146D, and the bottom surface of the protrusion 148P may be in contact with an edge of a top surface of the lower work-function control layer 142.

In a process of forming the upper gate electrode 134 according to some embodiments, after a preliminary work-function control layer (refer to 140 in FIG. 18B) is conformally formed on an inner wall of a trench 108, a lower filling metal layer 144 may be formed to fill a bottom portion of the trench 108, and a metal-containing liner (refer to 149 in FIG. 18D) may be formed on a portion of the preliminary work-function control layer, which is exposed within the trench 108 at a higher level than the lower filling metal layer 144. The metal-containing liner may include a work-function controlling metal material. The work-function controlling metal material may be diffused from the metal-containing liner into the preliminary work-function control layer, thereby forming an upper work-function control layer 146D. Thereafter, the metal-containing liner may be removed. During the process of removing the metal-containing liner, a portion of a sidewall of the upper work-function control layer 146D may be removed together. Thus, as shown in FIG. 8, the first width W1D of the upper work-function control layer 146D may be less than the second width W2D of the lower work-function control layer 142.

Figure 9:
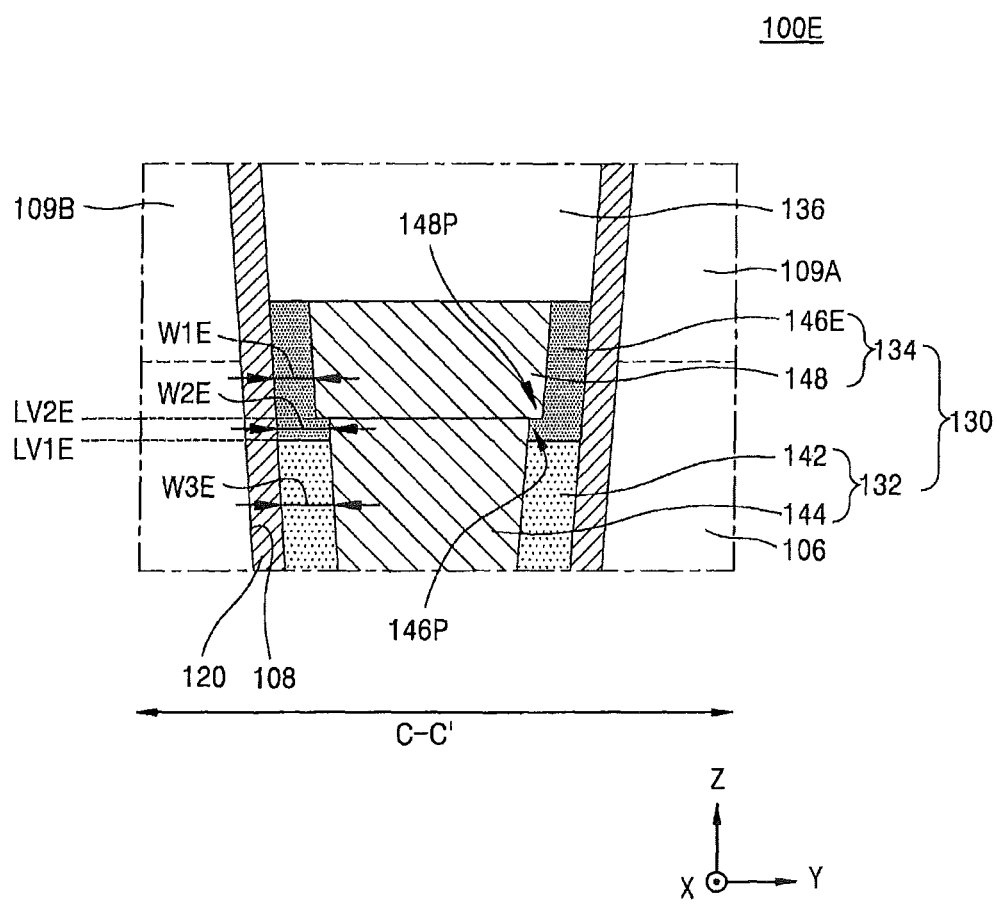
FIG. 9 is a cross-sectional view of a semiconductor device according to some embodiments.

FIG. 9 is a cross-sectional view of a semiconductor device 100E according to some embodiments. FIG. 9 is an enlarged cross-sectional view corresponding to the line C-C' of FIG. 1. In FIG. 9, the same reference numerals are used to denote the same elements as in FIGS. 1 to 8.

Referring to FIG. 9, an upper portion of an upper work-function control layer 146E may have a first width W1E in a second direction (or Y direction), and a lower portion of the upper work-function control layer 146E may have a second width W2E larger than the first width W1E in the second direction (or Y direction). A lower work-function control layer 142 may have a third width W3E greater than the first width W1E in the second direction (or Y direction). A bottom level LV1E of the upper work-function control layer 146E may be lower than a bottom level LV2E of an upper filling metal layer 148, and the upper work-function control layer 146E may include a protrusion 146P, which may protrude in a lateral direction toward a lower filling metal layer 144 at a lower level than the bottom level LV2E of the upper filling metal layer 148. As shown in FIG. 9, the protrusion 146P of the upper work-function control layer 146E may be in contact with the protrusion 148P of the upper filling metal layer 148.

In a process of forming the upper gate electrode 134 according to some embodiments, after a preliminary work-function control layer (refer to 140 in FIG. 18B) is conformally formed on an inner wall of a trench 108, the lower filling metal layer 144 may be formed to fill a bottom portion of the trench 108. A metal-containing liner (refer to 149 in FIG. 18D) may be formed on a portion of the preliminary work-function control layer, which is exposed within the trench 108 at a higher level than the lower filling metal layer 144. The metal-containing liner may include a work-function controlling metal material. The work-function controlling metal material may be diffused from the metal-containing liner into the preliminary work-function control layer so that the upper work-function control layer 146E having the bottom level LV1E that is lower than a top surface of the lower filling metal layer 144 may be formed. Thereafter, the metal-containing liner may be removed. During the process of removing the metal-containing liner, a portion of a sidewall of the upper work-function control layer 146E may be removed together. Thus, as shown in FIG. 9, the upper work-function control layer 146E may include the protrusion 146P.

Figure 10:
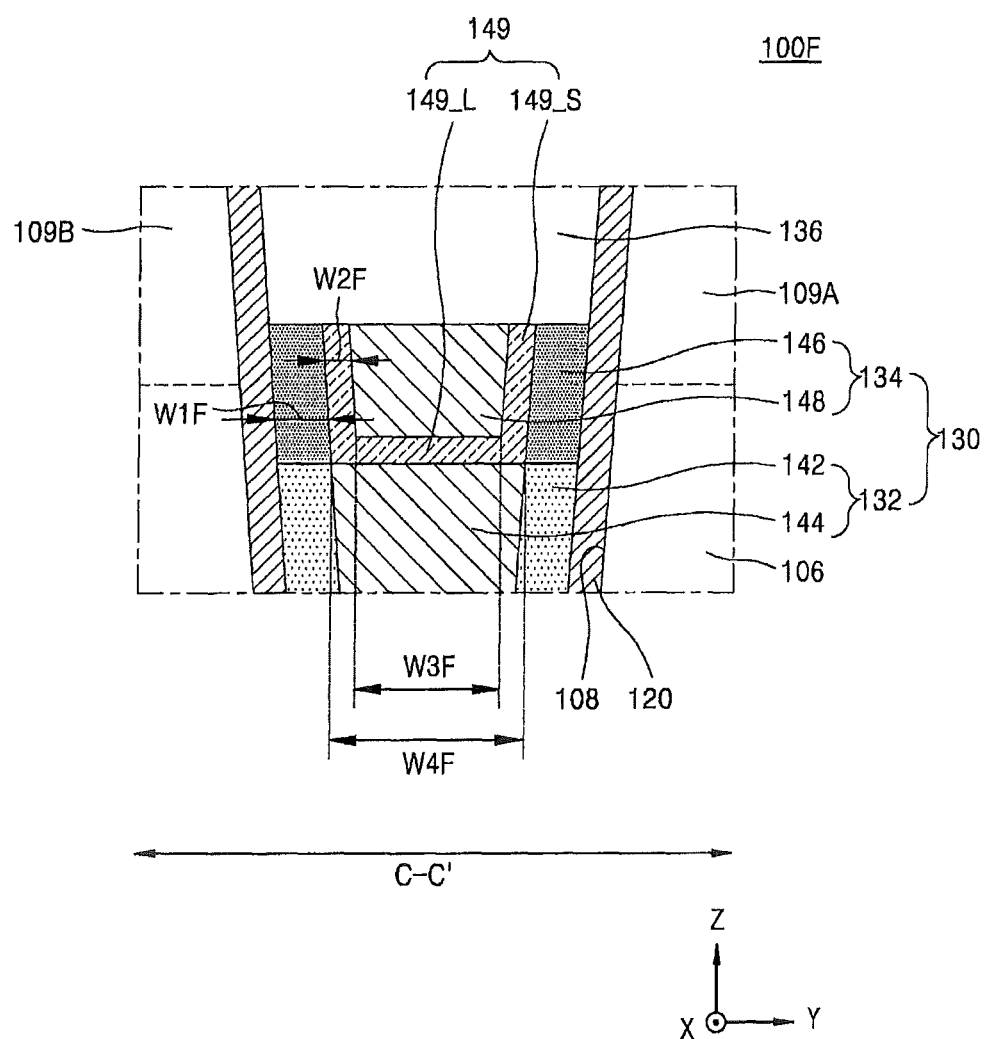
FIG. 10 is a cross-sectional view of a semiconductor device according to some embodiments.

FIG. 10 is a cross-sectional view of a semiconductor device 100F according to some embodiments. FIG. 10 is an enlarged cross-sectional view corresponding to the line C-C' of FIG. 1. In FIG. 10, the same reference numerals are used to denote the same elements as in FIGS. 1 to 9.

Referring to FIG. 10, a metal-containing liner 149 may be disposed between an upper work-function control layer 146 and an upper filling metal layer 148 and between the upper filling metal layer 148 and a lower filling metal layer 144.

The metal-containing liner 149 may include a work-function controlling metal material. The metal-containing liner 149 may include a metal material including lanthanum (La), strontium (Sr), antimony (Sb), yttrium (Y), aluminum (Al), tantalum (Ta), hafnium (Hf), or iridium (Ir). The metal-containing liner 149 may be formed by using an ALD process, a MOALD process, or an MOCVD process.

The metal-containing liner 149 may include a first portion 149_S formed on the upper work-function control layer 146 and a second portion 149_L formed on the lower filling metal layer 144. The first portion 149_S of the metal-containing liner 149 may be formed directly on the upper work-function control layer 146 and in contact with the upper work-function control layer 146. Also, the upper filling metal layer 148 may not be in contact with a lower filling metal layer 144.

In a process of forming an upper gate electrode 134 according to some embodiments, after a preliminary work-function control layer (refer to 140 in FIG. 18B) is conformally formed on an inner wall of a trench 108, the lower filling metal layer 144 may be formed to fill a bottom portion of the trench 108. Thereafter, a metal-containing liner 149 may be formed on a portion of the preliminary work-function control layer, which is exposed within the trench 108, at a higher level than the lower filling metal layer 144. A work-function controlling metal material may diffuse from the metal-containing liner 149 into the preliminary work-function control layer 140. Thus, a bottom surface of the upper work-function control layer 146 may be formed at substantially the same level as a bottom surface of the metal-containing liner 149. Thereafter, the upper filling metal layer 148 may be formed on the metal-containing liner 149 and fill the remaining portion of the trench 108.

In some embodiments, the upper work-function control layer 146 may have a first thickness W1F of about 10 Å to about 50 Å, and the metal-containing liner 149 may have a second thickness W2F of about 2 Å to about 10 Å. For example, the metal-containing liner 149 may have the second thickness W2F, which is equal to about 5% to 20% of the first thickness W1F of the upper work-function control layer 146. If the second thickness W2F of the metal-containing liner 149 is excessively small, an excessively small content (e.g., concentration/percentage/amount) of the work-function controlling metal material may diffuse into the upper work-function control layer 146, and a GIDL may not be greatly reduced. In contrast, when the second thickness W2F of the metal-containing liner 149 is excessively large, a volume of the upper filling metal layer 148 may be reduced to increase a resistance of the gate structure 130. However, the second thickness W2F of the metal-containing liner 149 is not limited thereto but may be appropriately selected according to a thickness of the upper work-function control layer 146, annealing conditions, which can be optionally performed, and a kind/type/element and resistivity of the work-function controlling metal material.

As shown in FIG. 10, a side surface and a bottom surface of the upper filling metal layer 148 may be surrounded by the metal-containing liner 149, while the metal-containing liner 149 may not be formed on a side surface of the lower filling metal layer 144. Thus, a width W3F of a bottom surface of the upper filling metal layer 148 may be less than a width W4F of the lower filling metal layer 144.

Figure 11:
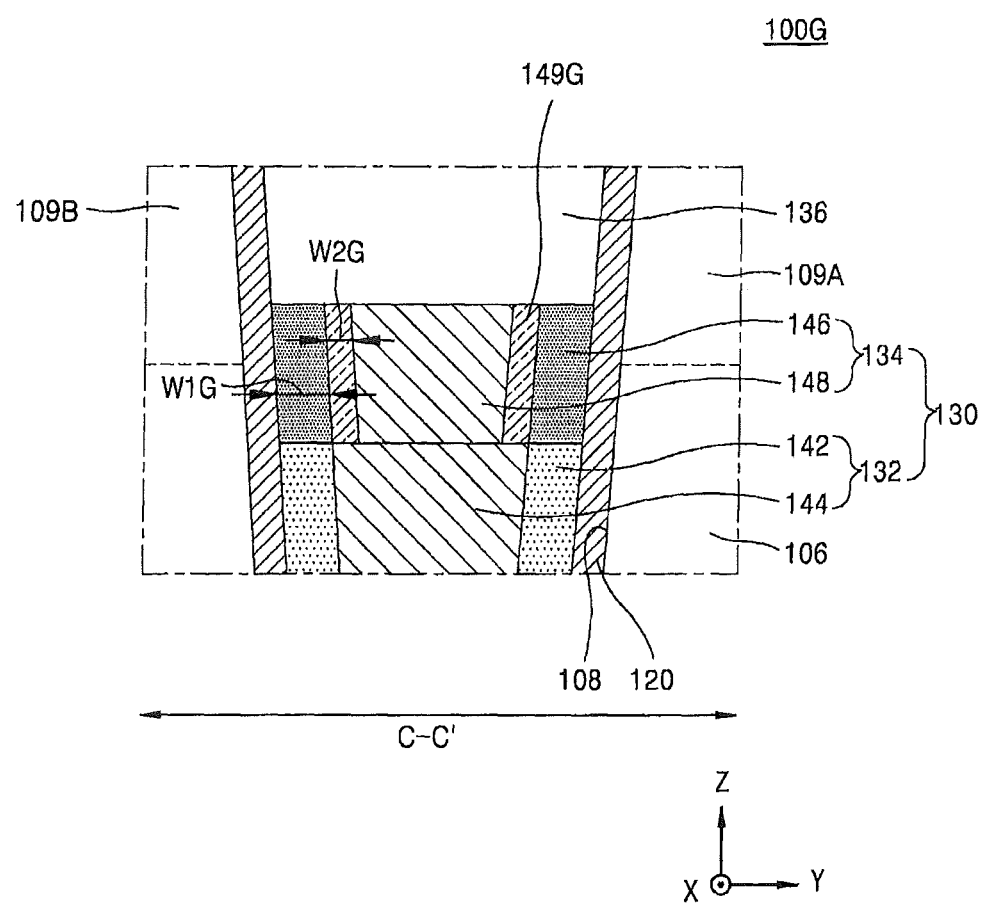
FIG. 11 is a cross-sectional view of a semiconductor device according to some embodiments.

FIG. 11 is a cross-sectional view of a semiconductor device 100G according to some embodiments. FIG. 11 is an enlarged cross-sectional view corresponding the line C-C' of FIG. 1. In FIG. 11, the same reference numerals are used to denote the same elements as in FIGS. 1 to 10.

Referring to FIG. 11, a metal-containing liner 149G may be located between an upper work-function control layer 146 and an upper filling metal layer 148. The metal-containing liner 149G may not be formed between the upper filling metal layer 148 and the lower filling metal layer 144, and the upper filling metal layer 148 may be in direct contact with the lower filling metal layer 144. Top surfaces of the upper work-function control layer 146, the metal-containing liner 149G, and the upper filling metal layer 148 may be at substantially the same level (i.e., may be coplanar).

For example, the metal-containing liner 149G may have a thickness W2G corresponding to about 5% to about 20% of a thickness W1G of the upper work-function control layer 146. The thickness W2G of the metal-containing liner 149G may be substantially constant in/along a vertical direction (Z direction). Meanwhile, repeated detailed descriptions of the metal-containing liner 149G may be omitted in view of the descriptions of the metal-containing liner 149 provided with reference to FIG. 10.

Figure 12:
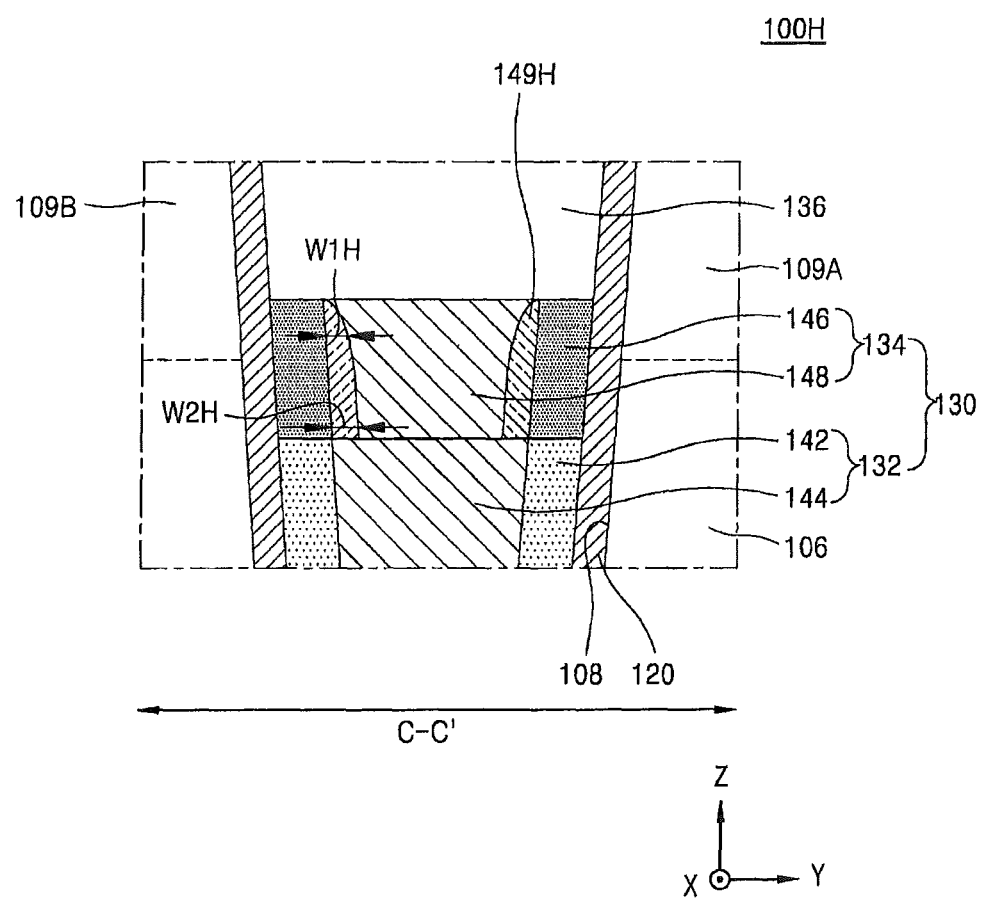
FIG. 12 is a cross-sectional view of a semiconductor device according to some embodiments.

FIG. 12 is a cross-sectional view of a semiconductor device 100H according to some embodiments. FIG. 12 is an enlarged cross-sectional view corresponding to the line C-C' of FIG. 1. In FIG. 12, the same reference numerals are used to denote the same elements as in FIGS. 1 to 11.

Referring to FIG. 12, a metal-containing liner 149H may have a spacer-type sectional shape, and an upper thickness W1H of the metal-containing liner 149H may be less than a lower thickness W2H of the metal-containing liner 149H.

In a process of forming an upper gate electrode 134 according to some embodiments, after the metal-containing liner (refer to 149 in FIG. 10) is formed as described with reference to FIG. 10, an anisotropic etching process may be performed on the metal-containing liner 149 so that a portion of the metal-containing liner 149 located on a lower filling metal layer 144 may be removed, and the metal-containing liner 149H may remain on a sidewall of an upper work-function control layer 146.

Figure 13:
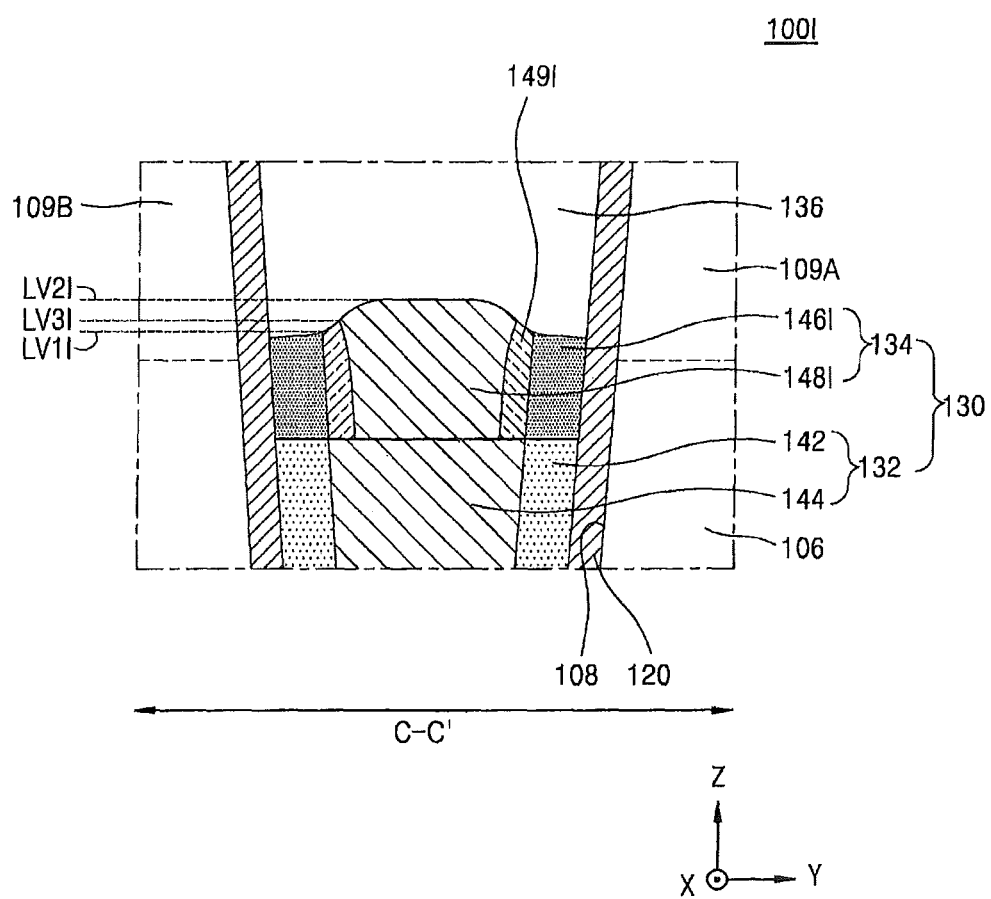
FIG. 13 is a cross-sectional view of a semiconductor device according to some embodiments.

FIG. 13 is a cross-sectional view of a semiconductor device 100I according to some embodiments. FIG. 13 is an enlarged cross-sectional view corresponding to the line C-C' of FIG. 1. In FIG. 13, the same reference numerals are used to denote the same elements as in FIGS. 1 to 12.

Referring to FIG. 13, a metal-containing liner 149I may be located between an upper work-function control layer 146I and an upper filling metal layer 148I, and a central portion of an upper gate electrode 134 may protrude upward. That is, a top level LV1I of an upper work-function control layer 146I may be lower than a top level LV2I of an upper filling metal layer 148I. A top level LV3I of a metal-containing liner 149I may be higher than the top level LV1I of the upper work-function control layer 146I and lower than the top level LV2I of the upper filling metal layer 148I. Top surfaces of the upper filling metal layer 148I, the metal-containing liner 149I, and the upper work-function control layer 146I may be continuously connected without sharp level differences.

In a process of forming the upper gate electrode 134 according to some embodiments, after the metal-containing liner 149 (refer to 149 in FIG. 10) is formed as described with reference to FIG. 10, an anisotropic etching process may be performed on the metal-containing liner 149 so that a metal-containing liner 149I may remain on a sidewall of the upper work-function control layer 146I. Thereafter, an upper filling conductive layer may be formed to fill the remaining portion of the trench 108. An upper portion of the upper filling conductive layer may be removed by an etchback process to form an upper filling metal layer 148I. During the etchback process, upper portions of the upper work-function control layer 146I and the metal-containing liner 149I may also be removed. When the etchback process adopts an etching condition where etch rates of the upper work-function control layer 146I and the metal-containing liner 149I are higher than an etch rate of the upper filling metal layer 148I, the top levels LV1I and LV3I of the upper work-function control layer 146I and the metal-containing liner 149I may be lower than the top level LV2I of the upper filling metal layer 148I.

In the semiconductor device 100I, since the top level LV1I of the upper work-function control layer 146I located relatively near the inner wall of the trench 108 is lower than the top level LV2I of the upper filling metal layer 148I, a sufficient distance between an edge portion of the upper gate electrode 134 and bit line contact (refer to 152 in FIG. 2) may be ensured, and occurrence of an electrical short may be reduced/prevented during the formation of the bit line structure (refer to 150 in FIG. 2). Furthermore, the upper filling metal layer 148I having a relatively large volume may be formed in a limited space of the trench 108 so that the gate structure 130 may have a low resistance.

Figure 14:
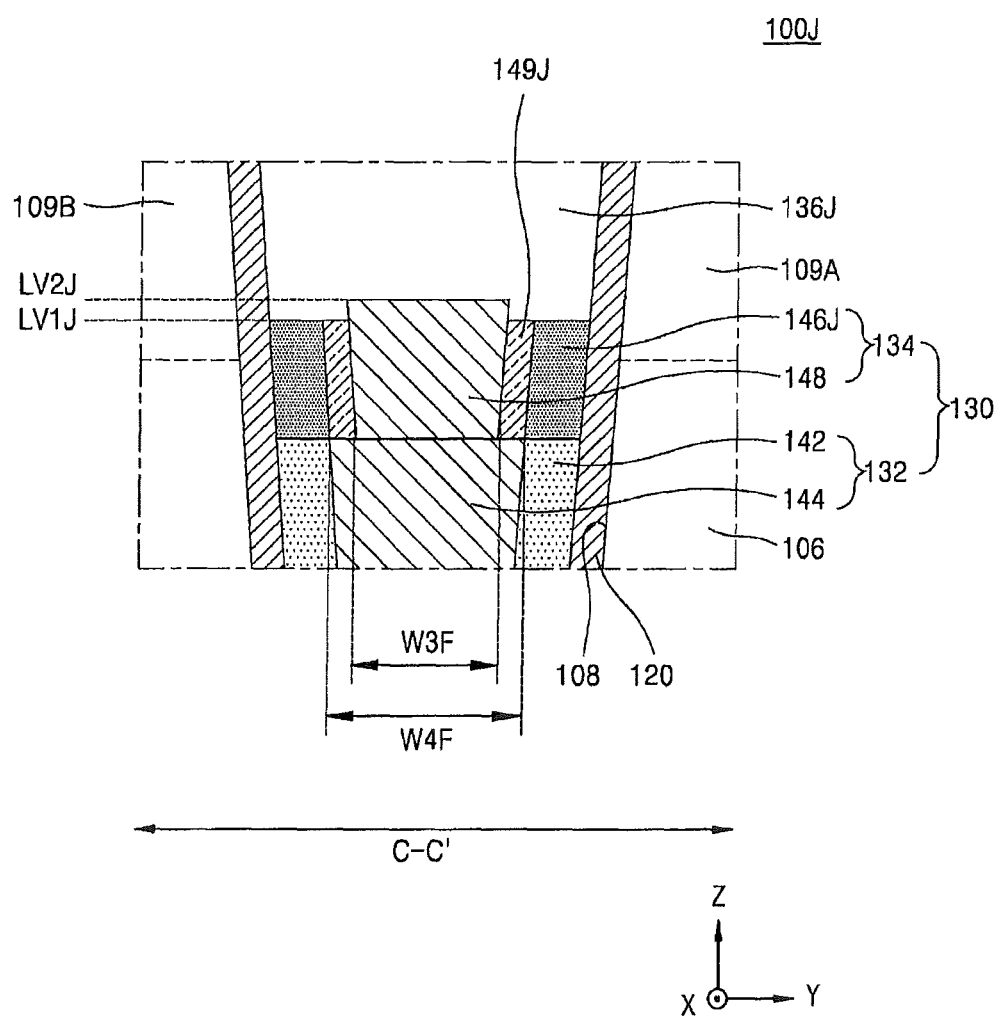
FIG. 14 is a cross-sectional view of a semiconductor device according to some embodiments.

FIG. 14 is a cross-sectional view of a semiconductor device 100J according to some embodiments. FIG. 14 is an enlarged cross-sectional view corresponding to the line C-C' of FIG. 1. In FIG. 14, the same reference numerals are used to denote the same elements as in FIGS. 1 to 13.

Referring to FIG. 14, a top level LV1J of an upper work-function control layer 146J may be lower than a top level LV2J of an upper filling metal layer 148, and a top surface of a metal-containing liner 149J may be at substantially the same level as a top level LV1J of the upper work-function control layer 146J. Also, there may be a sharp difference between a top level of the metal-containing liner 149J and the top level LV2J of the upper filling metal layer 148, and side surfaces of the upper filling metal layer 148 may be exposed at a level higher than the top surface of the metal-containing liner 149J. A gate capping layer 136J may be in contact with the side surfaces of the upper filling metal layer 148. However, present inventive concepts are not limited thereto. As shown in FIG. 6, the void (refer to 136V in FIG. 6) may be formed in a space between the upper filling metal layer 148 and the gate insulating layer 120 at a higher level than the top surface of the metal-containing liner 149J.

In a process of forming an upper gate electrode 134 according to some embodiments, after the metal-containing liner 149J is formed and an upper filling conductive layer is formed to fill the remaining portion of the trench 108, an upper portion of the upper filling conductive layer may be removed by an etchback process, thereby forming the upper filling metal layer 148. During the etchback process, the upper work-function control layer 146J and the metal-containing liner 149J may be etched at a relatively high etch rate. As a result, the top level LV1J of the upper work-function control layer 146J may be lower than the top level LV2J of the upper filling metal layer 148.

In a process of forming the upper gate electrode 134 according to some embodiments, after the upper gate electrode 134 having a top surface formed at the same level is formed as described with reference to FIG. 11, a wet etching process for removing only the upper work-function control layer 146J and the metal-containing liner 149J to a predetermined height may be further performed. During the wet etching process, the upper filling metal layer 148 may be insignificantly/hardly removed, while only the upper work-function control layer 146J and the metal-containing liner 149J may be removed, thereby forming the upper gate electrode 134 having a discontinuous top level as shown in FIG. 14.

In the semiconductor device 100J, the top level LV1J of the upper work-function control layer 146J located near the inner wall of the trench 108 may be lower than the top level LV2J of the upper filling metal layer 148. Thus, a sufficient distance between an edge portion of the upper gate electrode 134 and the bit line contact (refer to 152 in FIG. 2) may be ensured, and occurrence of an electrical short may be impeded/prevented during the formation of the bit line structure (refer to 150 in FIG. 2). Furthermore, the upper filling metal layer 148 having a relatively large volume may be formed in a limited space of the trench 108 so that the gate structure 130 may have a low resistance.

Figure 15:
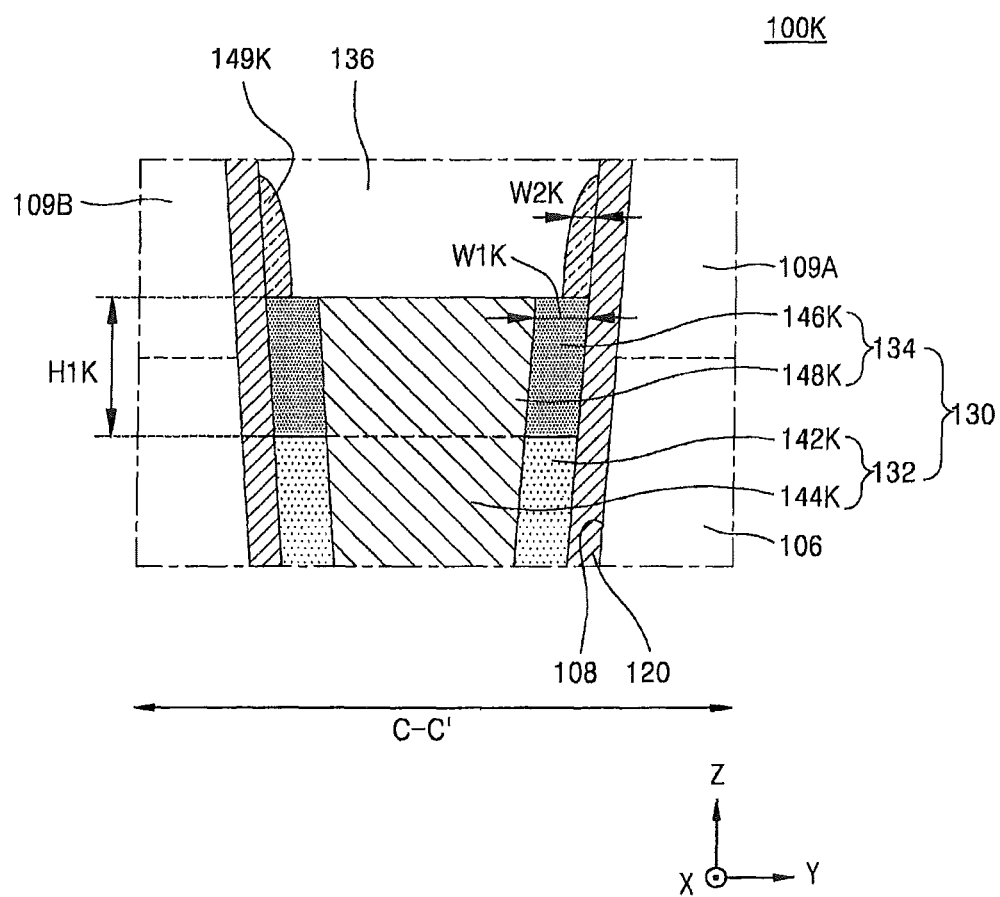
FIG. 15 is a cross-sectional view of a semiconductor device according to some embodiments.

FIG. 15 is a cross-sectional view of a semiconductor device 100K according to some embodiments. FIG. 15 is an enlarged cross-sectional view corresponding to the line C-C' of FIG. 1. In FIG. 15, the same reference numerals are used to denote the same elements as in FIGS. 1 to 14.

Referring to FIG. 15, an upper filling metal layer 148K of an upper gate electrode 134 may be formed integrally with a lower filling metal layer 144K of a lower gate electrode 132.

A metal-containing liner 149K may be formed on an inner wall of a trench 108, a side surface of the metal-containing liner 149K may be in contact with a gate insulating layer 120, and a bottom surface of the metal-containing liner 149K may be in contact with a top surface of an upper work-function control layer 146K. FIG. 15 illustrates an example in which a width W2K of the metal-containing liner 149K in a second direction (Y direction) is less than a width W1K of an upper work-function control layer 146K in the second direction (Y direction). Alternatively, in some embodiments, the width W2K of the metal-containing liner 149K may be greater than the width W1K of the upper work-function control layer 146K, and the bottom surface of the metal-containing liner 149K may be in contact with a portion of a top surface of the upper filling metal layer 148K.

The metal-containing liner 149K may include a work-function controlling metal material. The metal-containing liner 149K may include a metal oxide including lanthanum (La), strontium (Sr), antimony (Sb), yttrium (Y), aluminum (Al), tantalum (Ta), hafnium (Hf), or iridium (Ir). When the metal-containing liner 149K includes a metal oxide, the metal-containing liner 149K may include an insulating material. Here, a term "metal-containing liner" 149K may be interpreted as including a work-function controlling metal material, and it is not intended to exclude examples in which the metal-containing liner 149K includes both an insulating material and a metal. However, a material included in the metal-containing liner 149K is not limited to the above-described examples. The metal-containing liner 149K may include not only a metal oxide but also the above-described metals, a metal oxynitride, or a metal nitride.

In a process of forming a gate structure 130 according to some embodiments, a preliminary work-function control layer (refer to 140P1 in FIG. 20A) may be conformally formed on the inner wall of the trench 108, and a filling metal layer (refer to 140P2 in FIG. 20A) may be formed to fill the inside of the trench 108. A metal-containing liner (refer to 149K in FIG. 20A) may be formed on the filling metal layer and the preliminary work-function control layer. Thus, a work-function controlling metal material included/contained in the metal-containing liner 149K may be diffused into the preliminary work-function control layer, thereby forming the upper work-function control layer 146K. In this case, the upper work-function control layer 146K may have a first height H1K from a top surface of the lower filling metal layer 144K. Thereafter, an anisotropic etching process may be performed on the metal-containing liner 149K so that the metal-containing liner 149K may remain on the inner wall of the trench 108.

Figure 16:
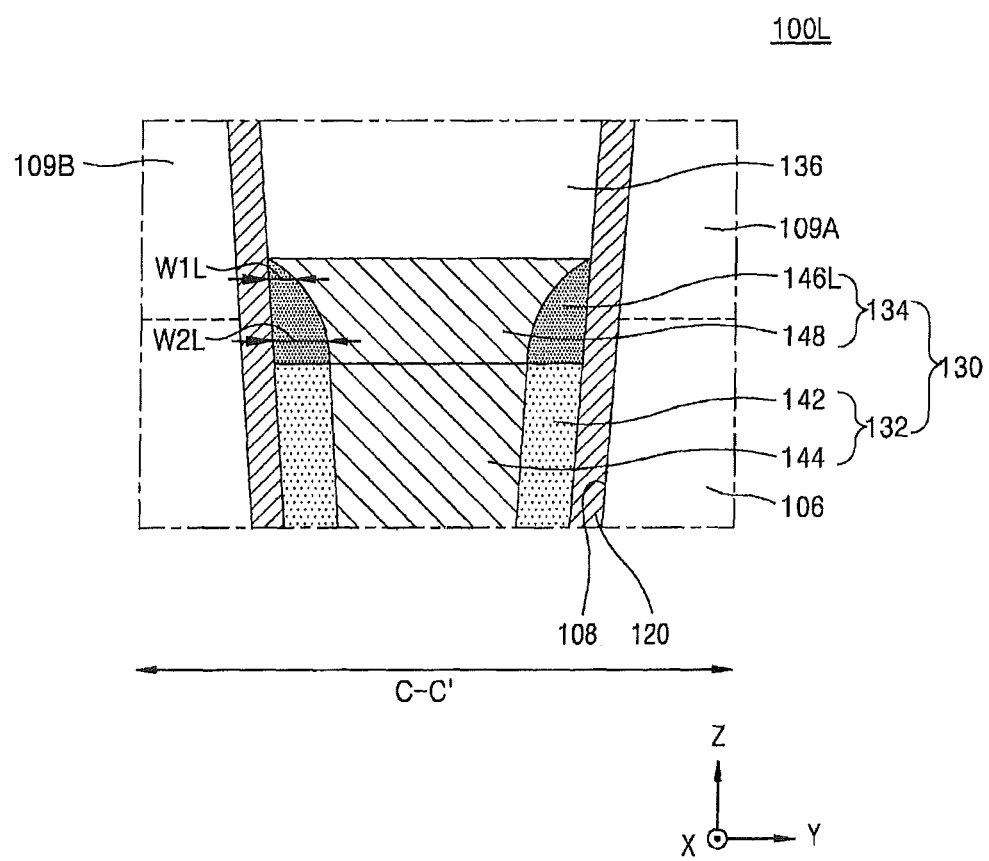
FIG. 16 is a cross-sectional view of a semiconductor device according to some embodiments.

FIG. 16 is a cross-sectional view of a semiconductor device 100L according to some embodiments. FIG. 16 is an enlarged cross-sectional view corresponding to the line C-C' of FIG. 1. In FIG. 16, the same reference numerals are used to denote the same elements as in FIGS. 1 to 15.

Referring to FIG. 16, an upper work-function control layer 146L may have a spacer-type sectional shape. An upper portion of the upper work-function control layer 146L may have a first width W1L in a second direction (or Y direction), and a lower portion of the upper work-function control layer 146L may have a second width W2L larger than the first width W1L in the second direction (or Y direction).

In a process of forming the upper gate electrode 134 according to some embodiments, after a preliminary work-function control layer (refer to 140 in FIG. 18B) is conformally formed on an inner wall of a trench 108, a first filling metal layer may be formed to fill the trench 108. An upper portion of the first filling metal layer may be removed by an etchback process to form a lower filling metal layer 144 inside the trench 108. During the etchback process, a sidewall of a portion of the preliminary work-function control layer, which is positioned at a higher level than the lower filling metal layer 144, may also be removed so that the preliminary work-function control layer may have a spacer-type sectional shape. Thereafter, a metal-containing liner (refer to 149 in FIG. 18D) may be formed on the lower filling metal layer 144 and a portion of the preliminary work-function control layer, and a work-function controlling metal material may be diffused from the metal-containing liner into the portion of the preliminary work-function control layer to form the upper work-function control layer 146L. The metal-containing liner may be removed.

Figure 17:
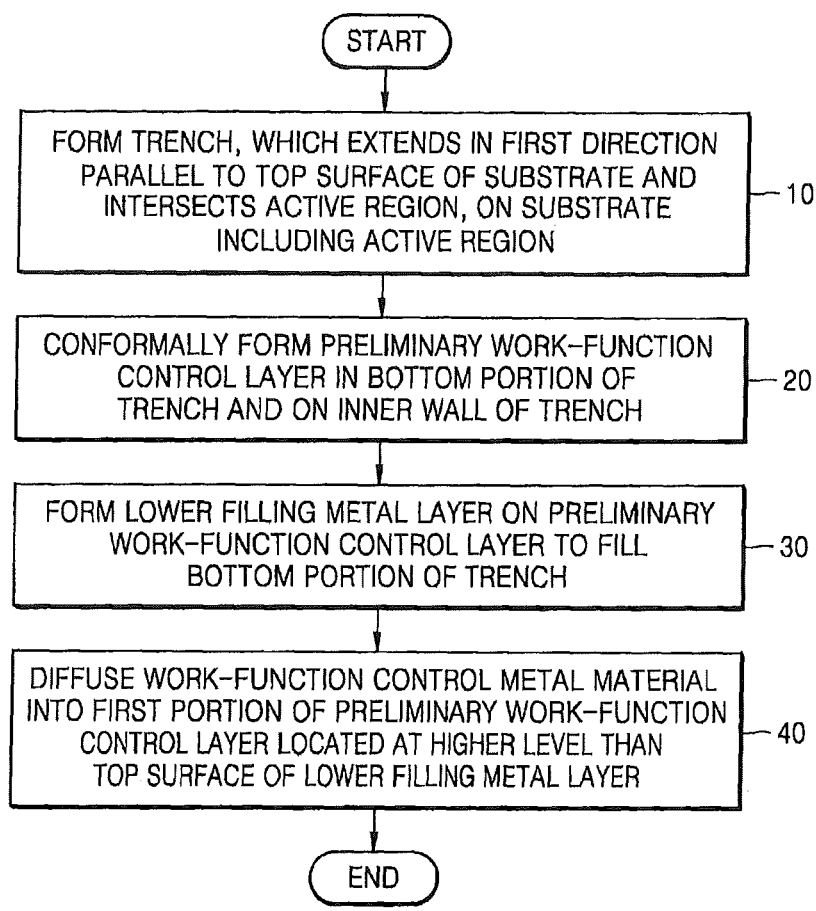
FIG. 17 is a flowchart of a method of manufacturing a semiconductor device according to some embodiments.

FIG. 17 is a flowchart of a method of manufacturing a semiconductor device 100 according to some embodiments.

FIGS. 18A to 18H are cross-sectional views of process operations of the method of manufacturing the semiconductor device 100, according to some embodiments.

Figure 18A:
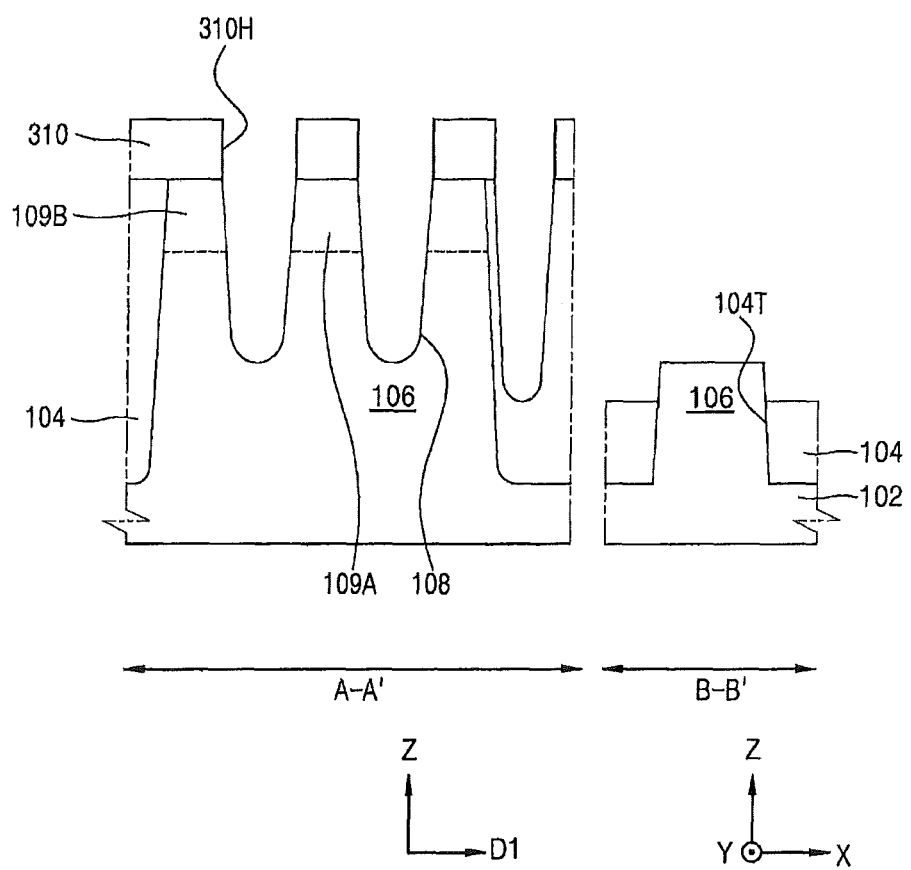
FIGS. 18A to 18H are cross-sectional views of process operations of a method of manufacturing a semiconductor device according to some embodiments.

Referring to FIGS. 17 and 18A, in operation 10, a device isolation trench 104T may be formed in the substrate 102, and an isolation layer 104 may be formed in the device isolation trench 104T. The active region 106 may be defined by the isolation layer 104 in the substrate 102. The active region 106 may have a relatively elongated island shape having a minor axis and a major axis as shown in FIG. 1. Repeated detailed descriptions of the substrate 102 may be omitted in view of the descriptions of the substrate 102 provided with reference to FIGS. 1 to 3. The isolation layer 104 may be a single layer including one kind/type of insulating layer or a multi-layered structure including at least two kinds/types of insulating layers.

Subsequently, a trench 108 may be formed on a substrate 102 including the active region 106. The trench 108 may extend in a first direction (X direction) parallel to a top surface of the substrate 102 and intersect the active region 106. In a process of forming the trench 108 according to some embodiments, a first mask 310 including a first opening 310H may be formed on the substrate 102, and the trench 108 may be formed by using the first mask 310 as an etch mask. Trenches 108 may extend parallel to one another and have line shapes intersecting the active region 106. In some embodiments, the substrate 102 and the isolation layer 104 may be etched together under an etching condition where an etch depth of the isolation layer 104 is different from an etch depth of the substrate 102, so that a stepped portion may be formed in a bottom surface of the trench 108. In some embodiments, to form a stepped portion in the bottom surface of the trench 108, the isolation layer 104 and the substrate 102 may be etched by using respectively different etching processes so that an etch depth of the isolation layer 104 may be different from an etch depth of the substrate 102.

In some embodiments, before performing processes for forming the trench 108 in the substrate 102, impurity ions may be implanted into the substrate 102 so that first and second source/drain regions 109A and 109B may be formed in an upper portion of the active region 106. Alternatively, in some embodiments, after the gate structure (refer to 130 in FIG. 18F) is formed to fill the trench 108, the first and second source/drain regions 109A and 109B may be formed on both sides of the gate structure 130.

Figure 18B:
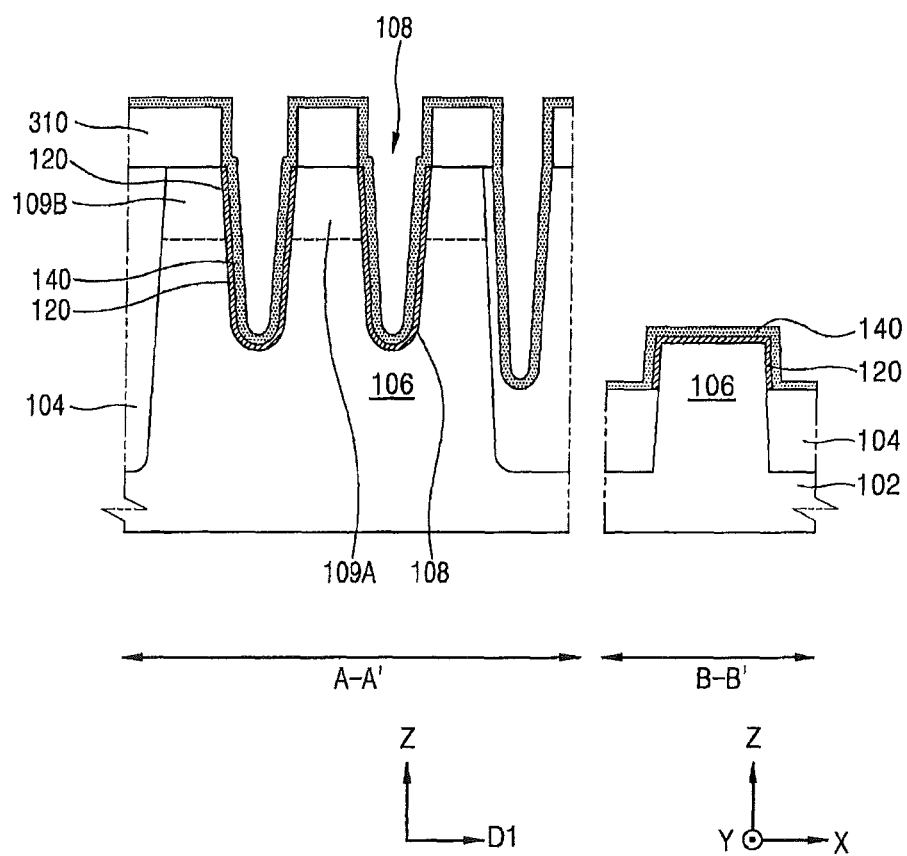

Referring to FIGS. 17 and 18B, in operation 20, a preliminary work-function control layer 140 may be conformally formed in a bottom portion of the trench 108 and an inner wall of the trench 108.

To begin with, as shown in FIG. 18B, a gate insulating layer 120 may be formed on the bottom portion and the inner wall of the trench 108. In some embodiments, the gate insulating layer 120 may be formed by using a thermal oxidation process, an ALD process, or a CVD process. For example, the gate insulating layer 120 may include silicon oxide formed at an exposed surface of the substrate 102 by the thermal oxidation process. In this case, as shown in FIG. 18B, the gate insulating layer 120 may be formed on an inner wall of a portion of the trench 108 located in the active region 106, while the gate insulating layer 120 is not formed on an inner wall of a portion of the trench 108 located in the isolation layer 104. Alternatively, the gate insulating layer 120 may include silicon oxide, silicon nitride, silicon oxynitride, or a high-k dielectric material formed by an LPCVD process, a PECVD process, an UHV-CVD process, or an ALD process. In some embodiments, in comparison with FIG. 18B, the gate insulating layer 120 may be formed on both inner walls of the trench 108 located in the active region 106 and the isolation layer 104.

A preliminary work-function control layer 140 may be conformally formed on the bottom portion and the inner wall of the trench 108. The preliminary work-function control layer 140 may be formed on the gate insulating layer 120 to a uniform thickness. The preliminary work-function control layer 140 may include a metal, a metal nitride, or a metal carbide, such as Ti, TiN, TiAlN, TiAlC, TiAlCN, TiSiCN, Ta, TaN, TaAlN, TaAlCN, and TaSiCN.

Figure 18C:
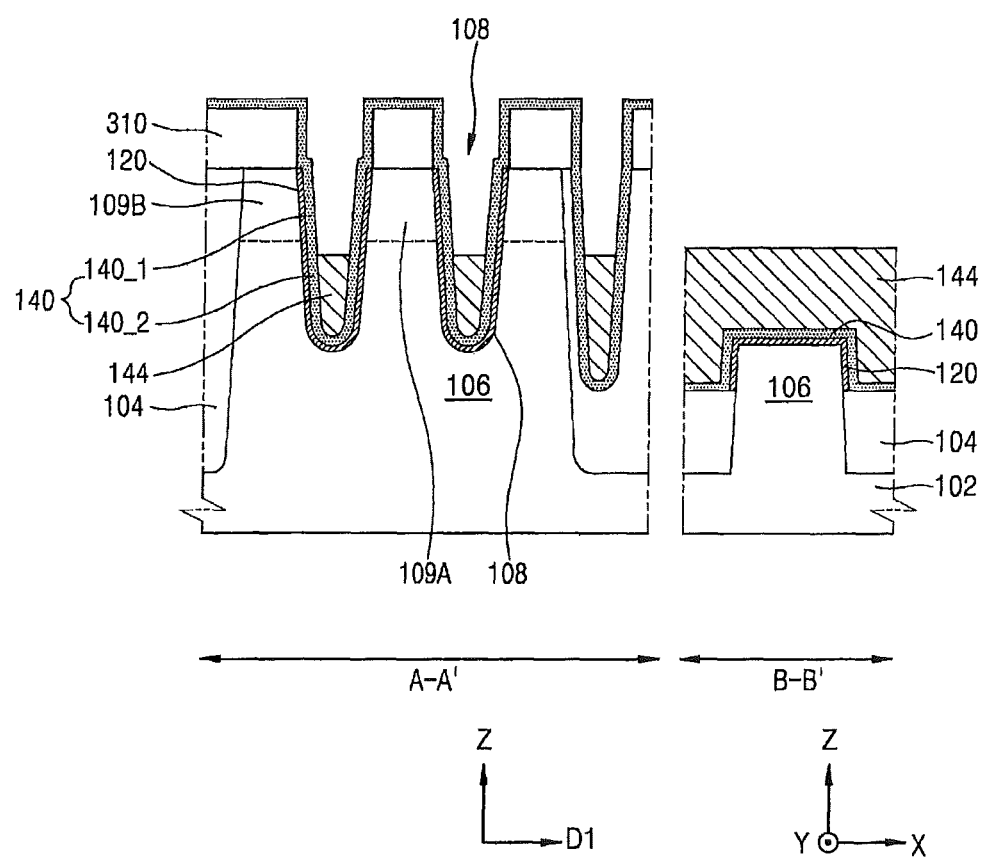

Referring to FIGS. 17 and 18C, in operation 30, a lower filling metal layer 144 may be formed on the preliminary work-function control layer 140 and fill the bottom portion of the trench 108.

A first filling metal layer filling the trench 108 may be formed on the substrate 102 on which the preliminary work-function control layer 140 is formed, and an upper portion of the first filling metal layer may be etched back to a partial height, thereby forming the lower filling metal layer 144. The lower filling metal layer 144 may be formed by using at least one of W, WN, TiN, and TaN.

During the etchback process of the first filling metal layer, the preliminary work-function control layer 140 may not be removed but remain on the inner wall of the trench 108. Thus, a portion of the preliminary work-function control layer 140 may be exposed on the inner wall of the trench 108 at a higher level than a top surface of the lower filling metal layer 144. Here, the portion of the preliminary work-function control layer 140 exposed at the higher level than the top surface of the lower filling metal layer 144 will be referred to as a first portion 140_1, while a portion of the preliminary work-function control layer 140, which is located at a lower level than the top surface of the lower filling metal layer 144 and covered with the lower filling metal layer 144, will be referred to as a second portion 140_2.

FIG. 18C illustrates an example in which the preliminary work-function control layer 140 is not removed. In some embodiments, however, an upper portion and/or a side portion of the preliminary work-function control layer 140 may be removed. For example, during the etchback process of the first filling metal layer, the upper portion and/or the side portion of the preliminary work-function control layer 140 may be removed so that the first portion 140_1 of the preliminary work-function control layer 140, which is exposed at a higher level than the top surface of the lower filling metal layer 144, may have a spacer-type sectional shape. In this case, the semiconductor device 100L described with reference to FIG. 16 may be formed.

Figure 18D:
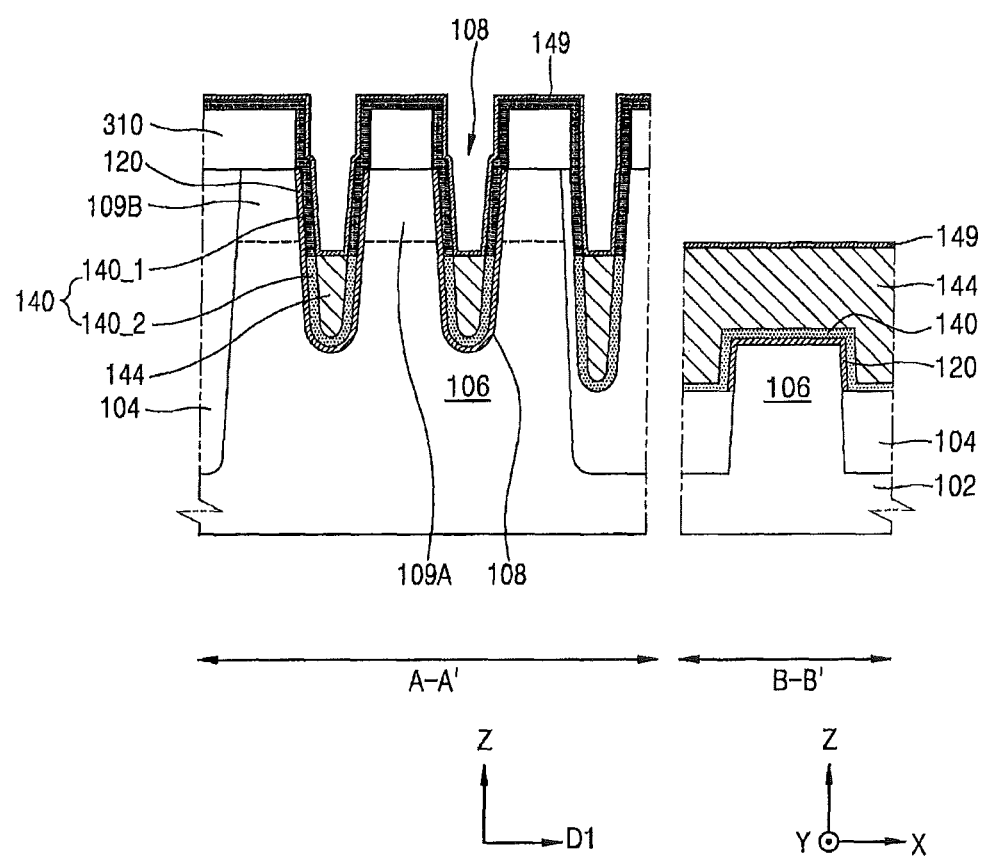

Referring to FIGS. 17 and 18D, in operation 40, a work-function controlling metal material may be diffused into the first portion 140_1 of the preliminary work-function control layer 140 such that a first work function of a material included in the first portion 140_1 of the preliminary work-function control layer 140, located at a higher level than the top surface of the lower filling metal layer 144, is less than a second work function of a material included in the second portion 140_2 of the preliminary work-function control layer 140, located at a lower level than the top surface of the lower filling metal layer 144.

A metal-containing liner 149 may be formed on the inner wall of the trench 108 so that the work-function controlling metal material may diffuse into the first portion 140_1 of the preliminary work-function control layer 140. The metal-containing liner 149 may be conformally formed on the first portion 140_1 of the preliminary work-function control layer 140 and the top surface of the lower filling metal layer 144 within the trench 108. Alternatively, the metal-containing liner 149 may be formed in the trench 108 before forming the preliminary work-function control layer 140.

The metal-containing liner 149 may include a work-function controlling metal material. The metal-containing liner 149 may include a metal including lanthanum (La), strontium (Sr), antimony (Sb), yttrium (Y), aluminum (Al), tantalum (Ta), hafnium (Hf), or iridium (Ir), and a metal oxide.

The work-function controlling metal material included in the metal-containing liner 149 may diffuse into the first portion 140_1 of the preliminary work-function control layer 140 which contacts the metal-containing liner 149. The work-function controlling metal material may be a material that may uniformly diffuse into a material included in the preliminary work-function control layer 140, and thus, the work-function controlling metal material may diffuse into the first portion 140_1 of the preliminary work-function control layer 140 from the metal-containing liner 149. In the first portion 140_1 of the preliminary work-function control layer 140, the work-function controlling metal material may be substantially and uniformly distributed, or may be distributed with a gradient in its concentration profile according to a vertical direction (Z direction) and/or a horizontal direction (Y direction).

Optionally, an annealing process may be performed on the substrate 102 on which the metal-containing liner 149 is formed, so that the work-function controlling metal material included in the metal-containing liner 149 may further diffuse into the first portion 140_1 of the preliminary work-function control layer 140.

The annealing process may be, for example, a rapid thermal annealing (RTA) process, but is not limited thereto. A temperature, time duration, and atmosphere of the annealing process may be appropriately selected according to kinds/types and thicknesses of the metal-containing liner 149 and the preliminary work-function control layer 140. Furthermore, process conditions of the annealing process may be determined such that the work-function controlling metal material included in the metal-containing liner 149 sufficiently diffuses into the first portion 140_1 of the preliminary work-function control layer 140 without changing properties of a gate insulating layer 120 or degrading reliability of the gate insulating layer 120.

In some embodiments, the process conditions of the annealing process may be selected such that the work-function controlling metal material included in the metal-containing liner 149 diffuses by a predetermined distance in a horizontal direction and/or a vertical direction into not only the first portion 140_1 of the preliminary work-function control layer 140 but also an upper portion of the second portion 140_2 of the preliminary work-function control layer 140. In this case, the semiconductor device 100C described with reference to FIG. 7 may be formed.

Figure 18E:
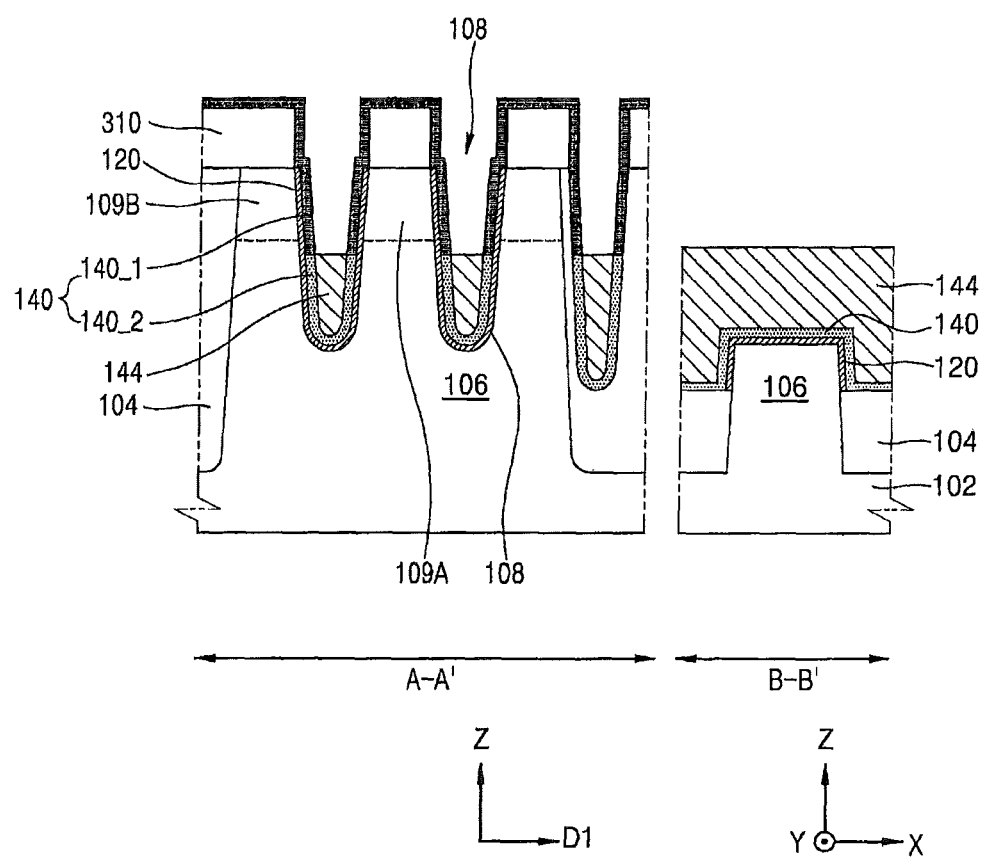

Referring to FIG. 18E, the metal-containing liner (refer to 149 in FIG. 18D) may be removed.

During the removal of the metal-containing liner 149, the first portion 140_1 of the preliminary work-function control layer 140 may not be removed, but rather may be exposed again on the inner wall of the trench 108. Also, the top surface of the lower filling metal layer 144, which has been covered with the metal-containing liner 149, may be exposed again on the inner wall of the trench 108.

During the removal of the metal-containing liner 149, a sidewall of the first portion 140_1 of the preliminary work-function control layer 140 may also be removed so that a width of the first portion 140_1 of the preliminary work-function control layer 140 may be less than a width of the second portion 140_2 of the preliminary work-function control layer 140. In this case, the semiconductor device 100D described with reference to FIG. 8 may be formed.

FIG. 18E illustrates an example in which the metal-containing liner 149 is completely removed, but present inventive concepts are not limited thereto. The metal-containing liner 149 may not be completely removed but remain. For example, an anisotropic etching process may be performed on the metal-containing liner 149 so that only a portion of the metal-containing liner 149 located on the top surface of the lower filling metal layer 144 may be removed, and a portion of the metal-containing liner 149 in contact with the sidewall of the first portion 140_1 of the preliminary work-function control layer 140 may remain. In this case, the semiconductor devices 100G, 100H, 100I, and 100J described with reference to FIGS. 11 to 14 may be formed. Also, in some embodiments, the process of removing the metal-containing liner 149 may be omitted. In this case, not only the portion of the metal-containing liner 149 in contact with the sidewall of the first portion 140_1 of the preliminary work-function control layer 140 but also the portion of the metal-containing liner 149 on the lower filling metal layer 144 may remain. Accordingly, the semiconductor device 100F described with reference to FIG. 10 may be formed.

Figure 18F:
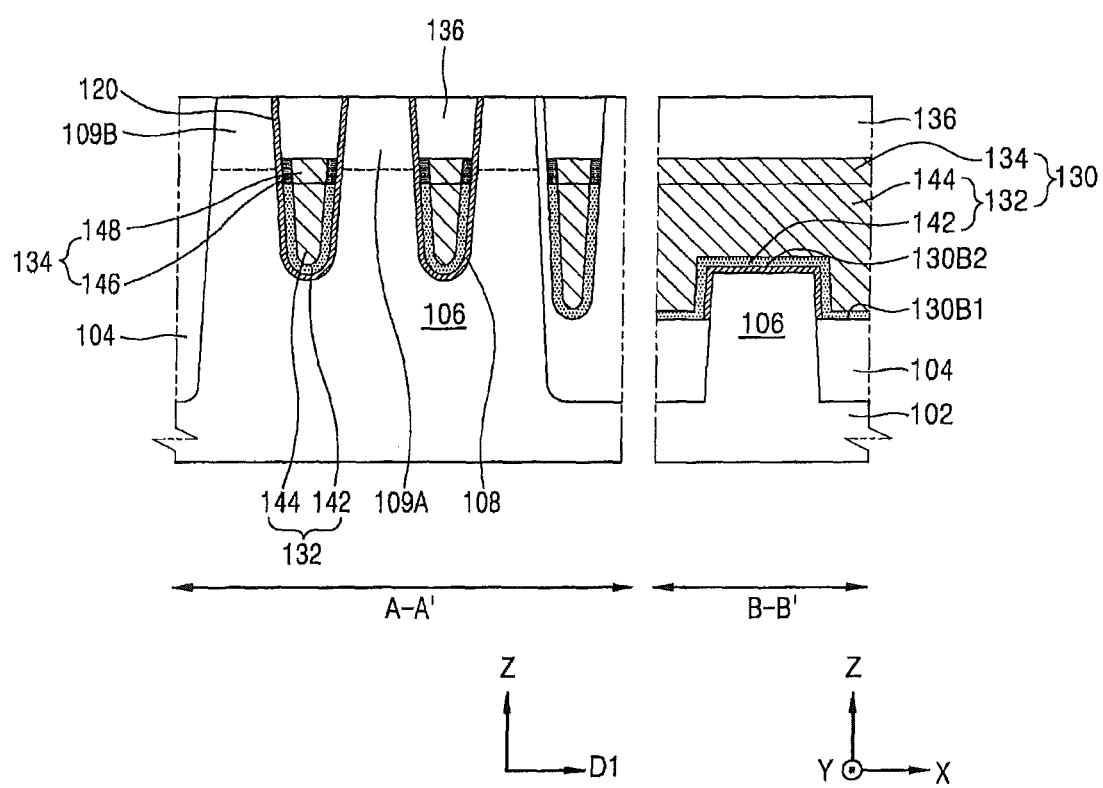

Referring to FIG. 18F, a second filling metal layer filling the trench 108 may be formed on the first portion 140_1 of the preliminary work-function control layer 140 and the lower filling metal layer 144. An upper portion of the second filling metal layer may be etched back to a partial height to form an upper filling metal layer 148. The upper filling metal layer 148 may be formed by using at least one of W, WN, TiN, and TaN.

In the process of etching back the second filling metal layer, an upper portion of the first portion 140_1 of the preliminary work-function control layer 140 may also be etched back to a partial height. Thus, a top surface of the first portion 140_1 of the preliminary work-function control layer 140 may be formed at the same level as a top surface of the upper filling metal layer 148. The first portion 140_1 of the preliminary work-function control layer 140, which is located on the sidewall of the upper filling metal layer 148 after etching back an upper portion of the preliminary work-function control layer 140, may be referred to as an upper work-function control layer 146. Also, the second portion 140_2 of the preliminary work-function control layer 140 may be referred to as a lower work-function control layer 142.

In some embodiments, during the etchback process, the first portion 140_1 of the preliminary work-function control layer 140 may be etched at a higher etch rate than the second filling metal layer, and the top surface of the first portion 140_1 of the preliminary work-function control layer 140 may be at a lower level than the top surface of the upper filling metal layer 148. In this case, the semiconductor devices 100A and 100B described with reference to FIGS. 5 and 6 may be formed.

Thereafter, the remaining portion of the trench 108 may be filled with an insulating material, and the insulating material may be planarized until the top surface of the substrate 102 is exposed so that a gate capping layer 136 may be formed on the inner wall of the trench 108. Subsequently, the first mask (refer to 310 in FIG. 18E) may be removed.

Figure 18G:
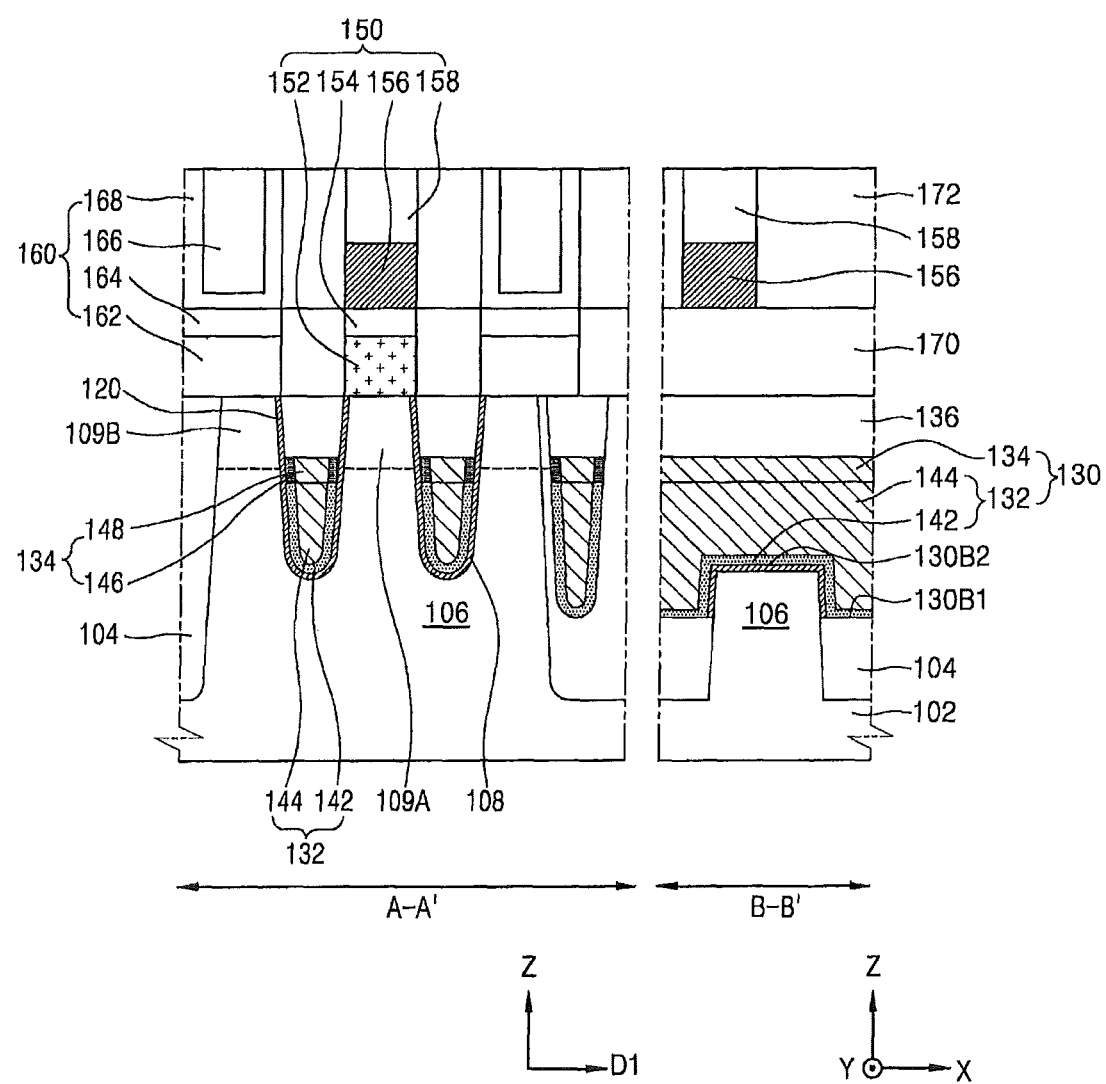

Referring to FIG. 18G, a first insulating interlayer 170 may be formed on the exposed top surface of the substrate 102. An opening may be formed through the first insulating interlayer 170 to expose the first source/drain region 109A, and a bit line contact 152 and a bit line intermediate layer 154 may be sequentially formed in the opening. The bit line contact 152 may be electrically connected to the first source/drain region 109A. Then, a bit line 156 and a bit line capping layer 158 which extend in a second direction may be formed on the first insulating interlayer 170.

A second insulating interlayer 172 may be formed on the first insulating interlayer 170 to cover side surfaces of the bit line 156 and the bit line capping layer 158. Thereafter, an opening may be formed in the first and second insulating interlayers 170 and 172 to expose a top surface of the second source/drain region 109B, and a contact structure 160 may be formed in the opening. The contact structure may include a lower contact pattern 162, a metal silicide layer 164, and an upper contact pattern 166, which may be electrically connected to the second source/drain region 109B, and a barrier layer 168 surrounding a side surface and a bottom surface of the upper contact pattern 166.

Figure 18H:
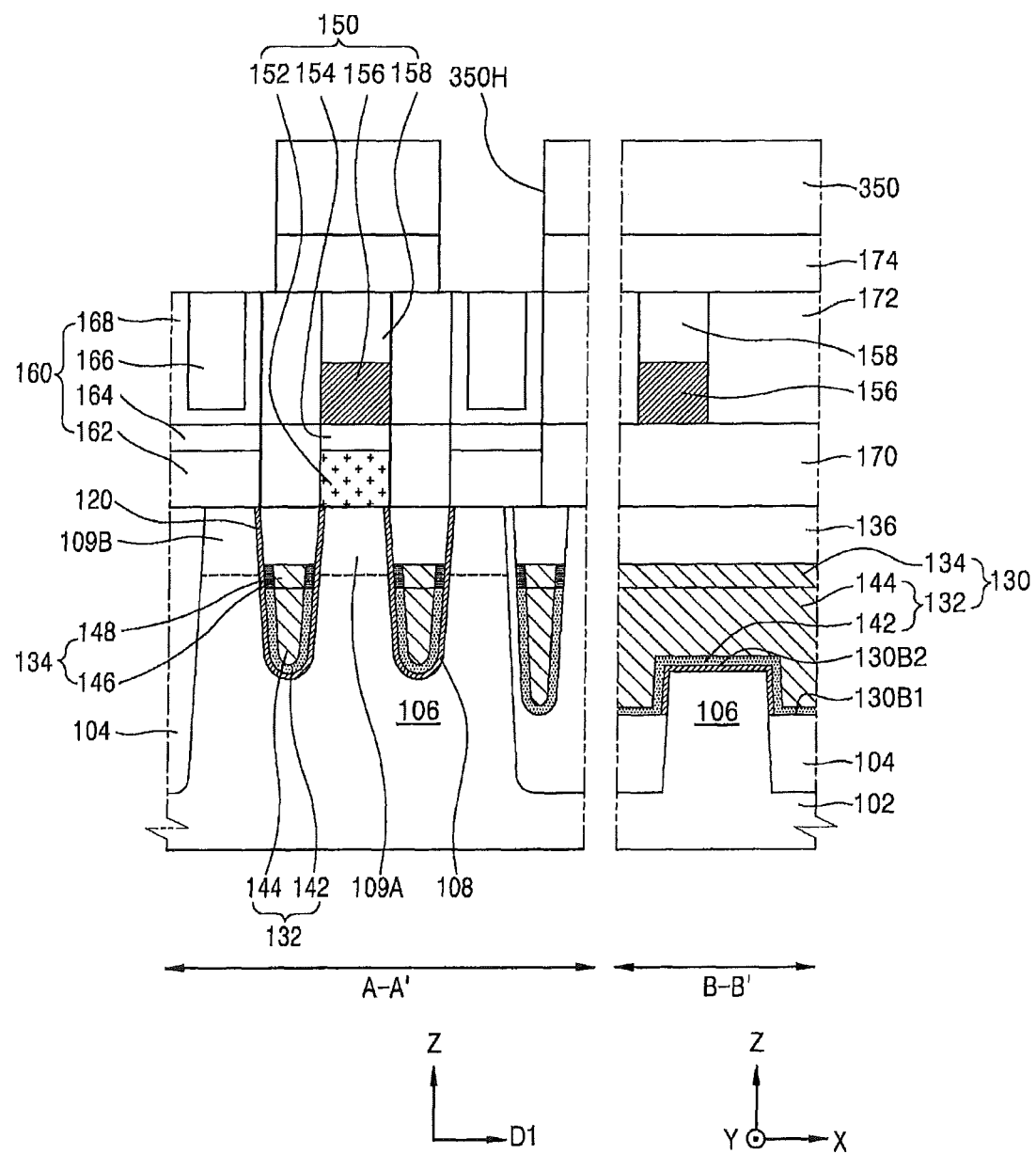

Referring to FIG. 18H, a support layer 174 and a mold layer 350 may be formed on the second insulating interlayer 172 and may include an opening 350H exposing a top surface of the contact structure 160.

A lower electrode 182 may be formed on the support layer 174 and the mold layer 350 and conformally cover an inner wall of the opening 350H, and the mold layer 350 may be removed. Subsequently, a capacitor dielectric layer 184 and an upper electrode 186 may be formed on the lower electrode 182.

The above-described processes may be performed, thereby completing the manufacture of the semiconductor device 100.

Figure 19:
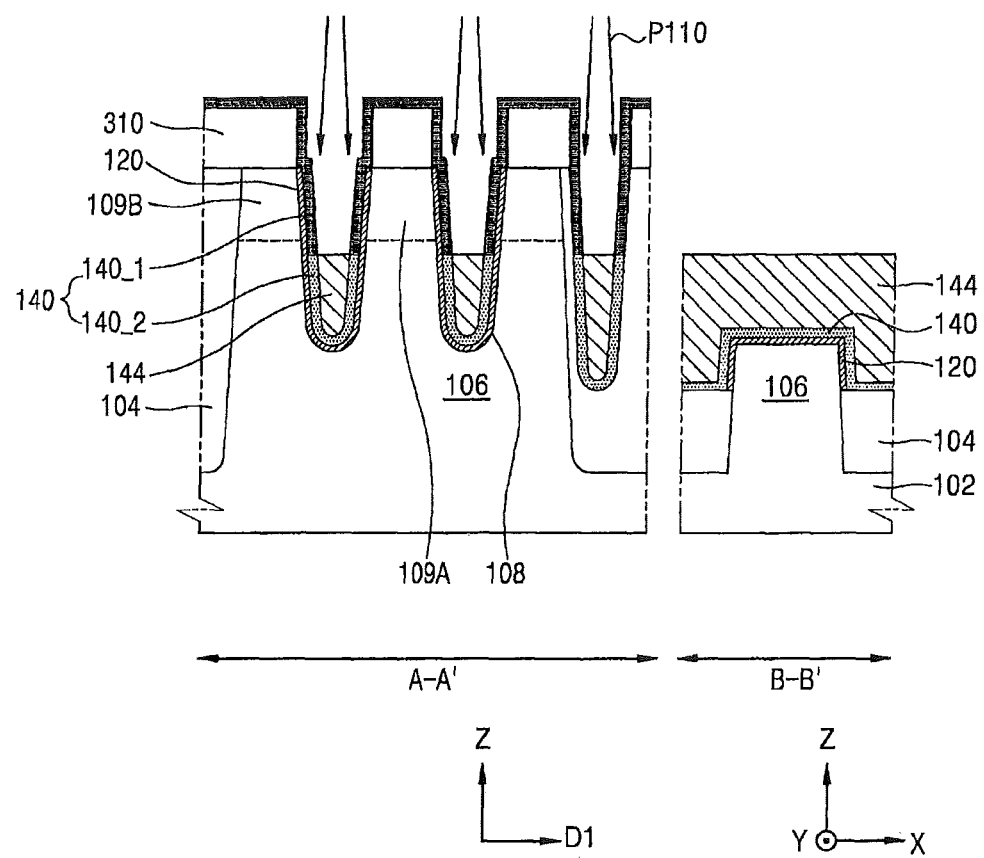
FIG. 19 is a cross-sectional view of a method of manufacturing a semiconductor device according to some embodiments.

FIG. 19 is a cross-sectional view of a method of manufacturing a semiconductor device 100 according to some embodiments.

To begin with, the processes described with reference to FIGS. 17 and 18A to 18C may be performed and thus, a gate insulating layer 120, a preliminary work-function control layer 140, and a lower filling metal layer 144 may be formed in a trench 108 of a substrate 102.

Referring to FIGS. 17 and 19, in operation 40, a work-function controlling metal material may be diffused into a first portion 140_1 of the preliminary work-function control layer 140 such that a first work function of a material included in a first portion 140_1 of the preliminary work-function control layer 140, located at a higher level than a top surface of the lower filling metal layer 144, is lower than a second work function of a material included in a second portion 140_2 of the preliminary work-function control layer 140, located at a lower level than the top surface of the lower filling metal layer 144.

In some embodiments, to diffuse the work-function controlling metal material into the first portion 140_1 of the preliminary work-function control layer 140, an ion implantation process P110 may be performed on the substrate 102 so that ions of the work-function controlling metal material may be implanted into the first portion 140_1 of the preliminary work-function control layer 140.

Ions of the work-function controlling metal material may be implanted into the first portion 140_1 of the preliminary work-function control layer 140, which is exposed in the trench 108 at a higher level than the top surface of the lower filling metal layer 144, while the work-function controlling metal material may be insubstantially/hardly implanted into the second portion 140_2 of the preliminary work-function control layer 140, which is located at a lower level than the top surface of the lower filling metal layer 144. Thus, the first portion 140_1 of the preliminary work-function control layer 140 into which the ions of the work-function controlling metal material are implanted may include a material having a substantially different composition from a material included in the second portion 140_2 of the preliminary work-function control layer 140. Here, the first portion 140_1 of the preliminary work-function control layer 140 into which the ions of the work-function controlling metal material are implanted may be referred to as an upper work-function control layer 146, while the second portion 140_2 of the preliminary work-function control layer 140 into which the work-function controlling metal material is not implanted may be referred to as a lower work-function control layer 142.

In some embodiments, the upper work-function control layer 146 may include a metal, a metal nitride, or a metal carbide, such as Ti, TiN, TiAlN, TiAlC, TiAlCN, TiSiCN, Ta, TaN, TaAlN, TaAlCN, and TaSiCN, which may contain the work-function controlling metal material at a first concentration/content. The first concentration/content may range from about 0.01 at % to about 10 at %, but is not limited thereto. The lower work-function control layer 142 may include a metal, a metal nitride, or a metal carbide, such as Ti, TiN, TiAlN, TiAlC, TiAlCN, TiSiCN, Ta, TaN, TaAlN, TaAlCN, and TaSiCN, which may not substantially include the work-function controlling metal material.

In some embodiments, the ion implantation process P110 may be an ion implantation process for implanting ions of a metal, such as lanthanum (La), strontium (Sr), antimony (Sb), yttrium (Y), aluminum (Al), tantalum (Ta), hafnium (Hf), or iridium (Ir). For example, the ion implantation process P110 may be performed at an ion implantation energy of about 10 keV to about 300 keV, but present inventive concepts are not limited thereto. For example, the ion implantation process P110 may be performed at an ion implantation dose of about $1 \times 10^{17}$ atoms/cm$^2$ to about $5 \times 10^{19}$ atoms/cm$^2$, but present inventive concepts are not limited thereto. Also, the ion implantation process P110 may be an oblique ion implantation process using an ion implantation inclination angle of about 0.1° to about 30° with respect to the top surface of the substrate 102. An ion implantation energy, dose, and inclination angle of the ion implantation process P110 may be appropriately selected according to a thickness of the preliminary work-function control layer 140 and a type/kind of the work-function controlling metal material implanted into the preliminary work-function control layer 140, and a required first concentration/content of the work-function controlling metal material.

In some embodiments, the ion implantation process P110 for implanting the work-function controlling metal material into the preliminary work-function control layer 140 may be an oblique ion implantation process, and an interface between the upper work-function control layer 146 and the lower work-function control layer 142 may be inclined at a predetermined angle with respect to the top surface of the substrate 102. Also, the work-function controlling metal material may be implanted and/or diffused into as far as an upper portion of the second portion 140_2 of the preliminary work-function control layer 140 located at a lower level than the top surface of the lower filling metal layer 144. Thus, a lowermost surface of the upper work-function control layer 146 may be located at a lower level than the top surface of the lower filling metal layer 144. In this case, the semiconductor device 100C described with reference to FIG. 7 may be formed.

Subsequently, an annealing process may be optionally performed on the substrate 102.

The annealing process may be, for example, an RTA process, but is not limited thereto. A temperature, time duration, and atmosphere of the annealing process may be appropriately selected according to a type/kind and thickness of the preliminary work-function control layer 140, a type/kind of the work-function controlling metal material, and a desired/required first concentration/content of the work-function controlling metal material. In addition, process conditions of the annealing process may be determined such that the work-function controlling metal material implanted into the first portion 140_1 of the preliminary work-function control layer 140 due to the ion implantation process P110 is sufficiently diffused and distributed throughout the entire volume of the first portion 140_1 of the preliminary work-function control layer 140 without changing properties of the gate insulating layer 120 or degrading reliability of the gate insulating layer 120.

In some embodiments, the process conditions of the annealing process may be determined such that the work-function controlling metal material implanted into the first portion 140_1 of the preliminary work-function control layer 140 due to the ion implantation process P110 is sufficiently diffused into an interface between the first portion 140_1 of the preliminary work-function control layer 140 and the gate insulating layer 120 and piled up around the interface in the first portion 140_1 of the preliminary work-function control layer 140 without changing the properties of the gate insulating layer 120 or degrading the reliability of the gate insulating layer 120.

In some embodiments, process conditions of the annealing process may be selected such that the work-function controlling metal material implanted into the first portion 140_1 of the preliminary work-function control layer 140 due to the ion implantation process P110 may diffuse into as far as an upper portion of the second portion 140_2 of the preliminary work-function control layer 140 located at a lower level than the top surface of the lower filling metal layer 144. In this case, a bottom surface of the upper work-function control layer 146 may be located at a lower level than the top surface of the lower filling metal layer 144. Thus, the semiconductor devices 100C and 100E described with reference to FIGS. 7 and 9 may be formed.

Subsequently, the processes described with reference to FIGS. 18F to 18H may be performed, thereby completing the manufacture of the semiconductor device 100.

Figure 20A:
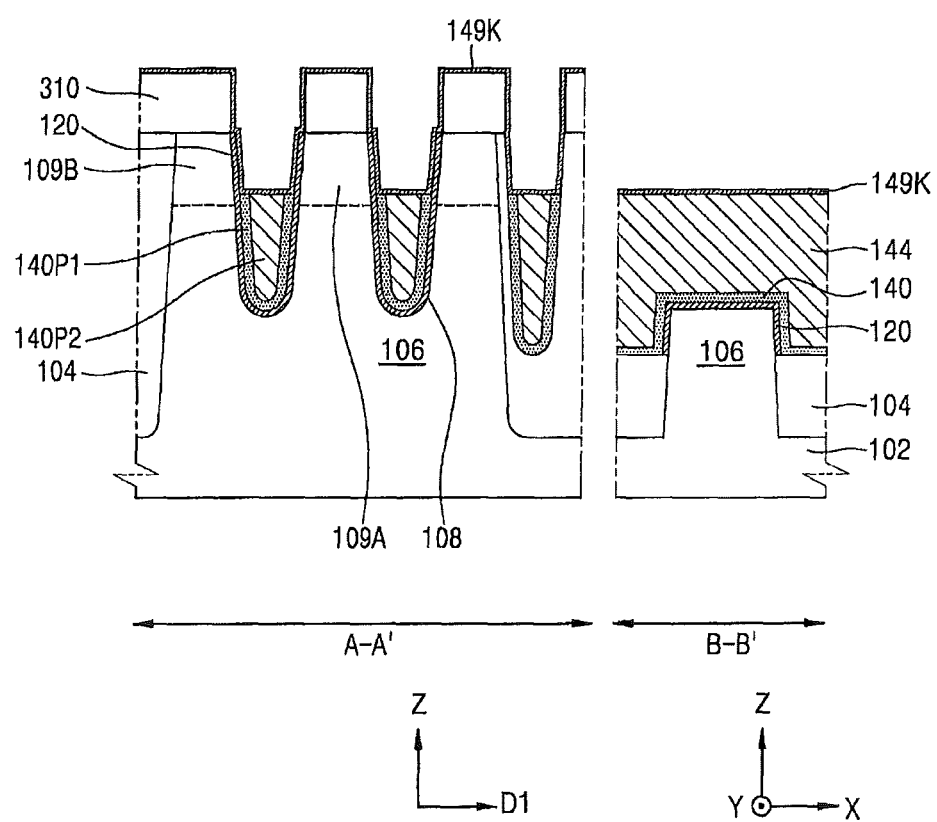
FIGS. 20A and 20B are cross-sectional views of a method of manufacturing a semiconductor device according to some embodiments.
Figure 20B:
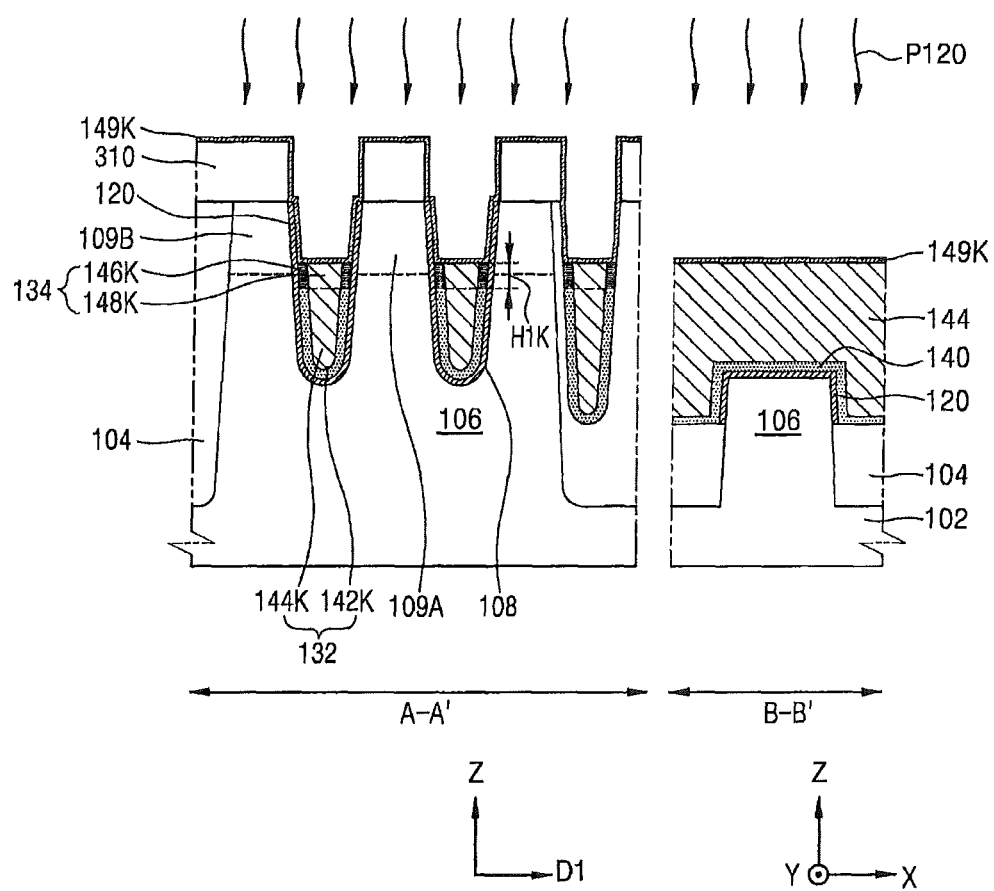

FIGS. 20A and 20B are cross-sectional views of a method of manufacturing a semiconductor device 100K (illustrated in FIG. 15) according to some embodiments.

To begin with, the processes described with reference to FIGS. 17 and 18A and 18B may be performed and thus, a gate insulating layer 120 and a preliminary work-function control layer 140P1 may be located in a trench 108 of a substrate 102.

Referring to FIG. 20A, a filling metal layer 140P2 may be formed on the preliminary work-function control layer 140P1 to fill the inside of the trench 108. Thereafter, upper portion of the filling metal layer 140P2 and the preliminary work-function control layer 140P1 may be etched back. Thus, top surfaces of the filling metal layer 140P2 and the preliminary work-function control layer 140P1 may be located within the trench 108 at a lower level than an uppermost surface of the substrate 102. FIG. 20A illustrates an example in which the top surface of the preliminary work-function control layer 140P1 is at substantially the same level as the top surface of the filling metal layer 140P2, but present inventive concepts are not limited thereto. Unlike the structure shown in FIG. 20A, an upper portion of the preliminary work-function control layer 140P1 may be further removed during the etchback process so that the top surface of the preliminary work-function control layer 140P1 is at a lower level than the top surface of the filling metal layer 140P2.

Thereafter, a metal-containing liner 149K may be conformally formed on an inner wall of the trench 108. The metal-containing liner 149K may be formed to a predetermined thickness on the gate insulating layer 120 and the top surfaces of the filling metal layer 140P2 and the preliminary work-function control layer 140P1 within the trench 108.

In some embodiments, the metal-containing liner 149K may include a work-function controlling metal material. The metal-containing liner 149K may include a metal oxide including lanthanum (La), strontium (Sr), antimony (Sb), yttrium (Y), aluminum (Al), tantalum (Ta), hafnium (Hf), or iridium (Ir). However, a material included in the metal-containing liner 149K is not limited to the above-described examples. The metal-containing liner 149K may include not only a metal oxide but also/alternatively the above-described metals, a metal oxynitride, or a metal nitride.

Referring to FIG. 20B, the work-function controlling metal material included in the metal-containing liner 149K may be diffused into the preliminary work-function control layer 140P1. For example, the work-function controlling metal material included in the metal-containing liner 149K may be diffused into the preliminary work-function control layer 140P1 to a first height/span H1K from the top surface of the preliminary work-function control layer 140P1.

Here, an upper portion of the preliminary work-function control layer 140P1, into which the work-function controlling metal material diffuses and which has the first height H1K from the top surface of the preliminary work-function control layer 140P1, may be referred to as an upper work-function control layer 146K, while a lower portion of the preliminary work-function control layer 140P1 located under the upper work-function control layer 146K may be referred to as a lower work-function control layer 142K. Also, a portion of the filling metal layer 140P2 located at the same level as the upper work-function control layer 146K may be referred to as an upper filling metal layer 148K, while a lower portion of the filling metal layer 140P2 located under the upper filling metal layer 148K may be referred to as a lower filling metal layer 144K.

Optionally, an annealing process P120 may be performed on the substrate 102 on which the metal-containing liner 149K is formed. The annealing process P120 may be an RTA process, but is not limited thereto. A temperature, time duration, and atmosphere of the annealing process P120 may be appropriately selected according to types/kinds and thicknesses of the metal-containing liner 149K and the preliminary work-function control layer 140P1 and a desired/required first height H1K. In some embodiments, however, metal atoms (e.g., lanthanum atoms) may naturally diffuse from the metal-containing liner 149K into the preliminary work-function control layer 140P1 without using the annealing process P120.

In some embodiments, the upper work-function control layer 146K may be integrally formed with the lower work-function control layer 142K, and the upper filling metal layer 148K may be integrally formed with the lower filling metal layer 144K.

In some embodiments, the upper work-function control layer 146K may include the work-function controlling metal material at a first concentration/content. The first concentration/content may range from about 0.01 at % to about 10 at %, but is not limited thereto. Also, the first concentration/content of the work-function controlling metal material included in the upper work-function control layer 146K may be substantially constant or vary in a vertical direction (Z direction). For example, at least a partial region of the upper work-function control layer 146K may have a concentration/content profile in which the first concentration/content of the work-function controlling metal material decreases (is reduced) from the top surface toward the bottom surface of the upper work-function control layer 146K in the vertical direction (Z direction).

Thereafter, referring back to FIG. 15, an anisotropic etching process may be performed on the metal-containing liner 149K so that a portion of the metal-containing liner 149K located on the upper filling metal layer 148K may be removed, and the metal-containing liner 149K may remain on the upper work-function control layer 146K and the gate insulating layer 120.

Subsequently, the processes described with reference to FIGS. 18F to 18H may be performed, thereby completing the manufacture of the semiconductor device 100K.

Figure 21:
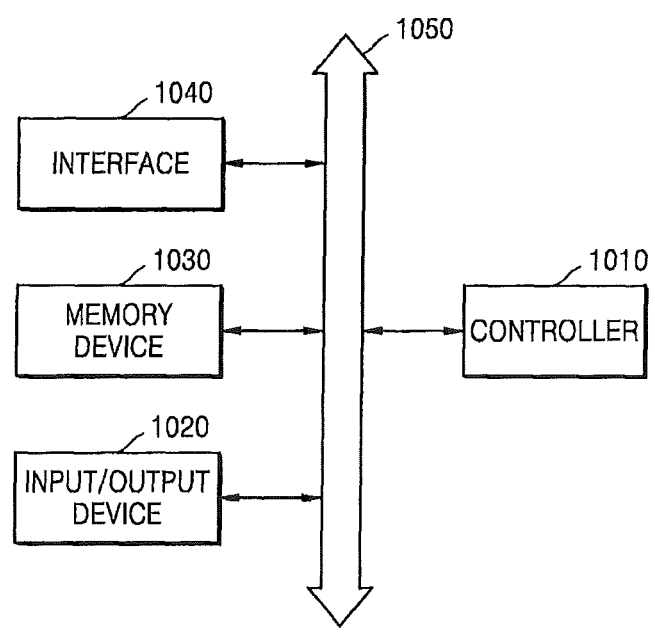
FIG. 21 is a block diagram of a system including a semiconductor device according to some embodiments.

FIG. 21 is a block diagram of a system 1000 including a semiconductor device according to some embodiments.

Referring to FIG. 21, the system 1000 may include a controller 1010, an input/output (I/O) device 1020, a memory device 1030, and an interface 1040. The system 1000 may be a mobile system or a system configured to transmit or receive information. In some embodiments, the mobile system may be a personal digital assistant (PDA), a portable computer, a web tablet, a wireless phone, a mobile phone, a digital music player, or a memory card. The controller 1010 may be configured to control an execution program in the system 1000 and may include a microprocessor, a digital signal processor (DSP), a microcontroller, or a similar device thereto. The I/O device 1020 may be used to input or output data to and from the system 1000. The system 1000 may be connected to an external device (e.g., a personal computer (PC) or a network) by using the I/O device 1020 and may exchange data with the external device. The I/O device 1020 may be, for example, a keypad, a keyboard, or a display device.

The memory device 1030 may store code and/or data for operations of the controller 1010 or store data processed by the controller 1010. The memory device 1030 may include at least one of the semiconductor devices 100, 100A, 100B, 100C, 100D, 100E, 100F, 100G, 100H, 1001, 100K, and 100L described with reference to FIGS. 1 to 20B, according to some embodiments.

The interface 1040 may be a data transmission path between the system 1000 and an external device. The controller 1010, the I/O device 1020, the memory device 1030, and the interface 1040 may communicate with one another via a bus 1050. The system 1000 may be used for a mobile phone, an MPEG-1 audio layer 3 (MP3) player, a navigation device, a portable multimedia player (PMP), a solid-state disk (SSD), or household appliances.

Figure 22:
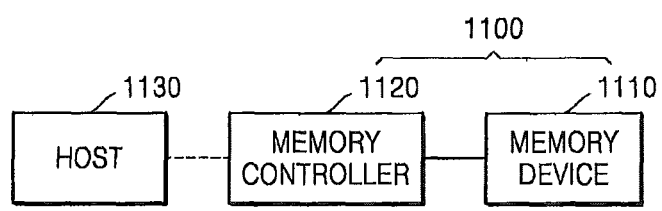
FIG. 22 is a block diagram of a memory card including a semiconductor device according to some embodiments.

FIG. 22 is a block diagram of a memory card 1100 including a semiconductor device according to some embodiments.

Referring to FIG. 22, the memory card 1100 may include a memory device 1110 and a memory controller 1120.

The memory device 1110 may store data. In some embodiments, the memory device 1110 may have non-volatile characteristics and retain stored data even if a power supply is interrupted. The memory device 1110 may include at least one of the semiconductor devices 100, 100A, 100B, 100C, 100D, 100E, 100F, 100G, 100H, 1001, 100K, and 100L described with reference to FIGS. 1 to 20B, according to some embodiments.

The memory controller 1120 may read data stored in the memory device 1110 or may store data in the memory device 1110 in response to read/write requests of a host 1130. The memory controller 1120 may include at least one of the semiconductor devices 100, 100A, 100B, 100C, 100D, 100E, 100F, 100G, 100H, 1001, 100K, and 100L described with reference to FIGS. 1 to 20B, according to some embodiments.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:
   forming a recess in a semiconductor substrate;
   forming a gate insulating layer on a bottom portion and an inner wall of the recess;
   forming a first metal layer on the gate insulating layer in the recess, the first metal layer including titanium nitride;
   forming a second metal layer between opposing sidewalls of a lower portion of the first metal layer in the recess, the second metal layer including tungsten;
   forming a metal-containing liner on the first and second metal layers in the recess, the metal-containing liner including lanthanum; and
   diffusing metal atoms from the metal-containing liner into an upper portion of the first metal layer in the recess.

2. The method of claim 1, further comprising:
   removing the metal-containing liner, wherein the metal-containing liner is a third metal layer;
   forming a fourth metal layer on the second metal layer and on opposing sidewalls of the upper portion of the first metal layer, after removing the metal-containing liner; and
   reducing a height of the fourth metal layer and a height of the first metal layer.

3. The method of claim 2, wherein a top surface of the first metal layer is formed at the same level as a top surface of the fourth metal layer.

4. The method of claim 2, wherein an interface of the second and fourth metal layers comprises oxide.

5. The method of claim 4, further comprising removing the oxide from the interface of the second and fourth metal layers.

6. The method of claim 1, wherein diffusing the metal atoms comprises performing an annealing process on the metal-containing liner.

7. The method of claim 1, further comprising:
   forming a source/drain region in the semiconductor substrate; and
   forming a bit line structure on the source/drain region.

8. The method of claim 1, wherein forming the first metal layer comprises forming a liner in the recess.

9. A method of forming a semiconductor device, the method comprising:
   forming a recess in a semiconductor substrate;
   forming a first metal layer in the recess;
   forming a second metal layer between opposing sidewalls of a lower portion of the first metal layer in the recess;
   forming a metal alloy with an upper portion of the first metal layer in the recess, wherein more of the metal alloy is formed with the upper portion of the first metal layer than with the lower portion of the first metal layer;
   forming a source/drain region in the semiconductor substrate; and
   forming a bit line structure on the source/drain region.

10. The method of claim 9, wherein forming the source/drain region comprises forming the source/drain region in the semiconductor substrate before forming the recess in the semiconductor substrate.

11. The method of claim 9, wherein forming the source/drain region comprises forming the source/drain region in the semiconductor substrate after forming the metal alloy with the upper portion of the first metal layer in the recess.

12. The method of claim 9, wherein forming the metal alloy comprises implanting metal ions into the upper portion of the first metal layer in the recess.

13. The method of claim 9, wherein forming the metal alloy comprises:
forming a third metal layer on the first and second metal layers in the recess; and
diffusing metal atoms from the third metal layer into the upper portion of the first metal layer in the recess.

14. The method of claim 13, further comprising:
removing the third metal layer; and
forming a fourth metal layer on the second metal layer and on opposing sidewalls of the upper portion of the first metal layer, after removing the third metal layer.

15. The method of claim 9, wherein:
forming the first metal layer comprises forming a titanium nitride liner in the recess;
the lower and upper portions of the first metal layer comprise lower and upper portions, respectively, of the titanium nitride liner;
forming the metal alloy comprises implanting or diffusing lanthanum atoms into the upper portion of the titanium nitride liner;
a vertical thickness, in the recess, of the upper portion of the titanium nitride liner is between 200 Angstroms and 300 Angstroms; and
a concentration of lanthanum atoms in the lower portion of the titanium nitride liner is less than 0.01 percent.

16. A method of forming a semiconductor device, the method comprising:
forming a recess in a semiconductor substrate;
forming a first metal layer in the recess;
forming a second metal layer between opposing sidewalls of a lower portion of the first metal layer in the recess, wherein the lower portion of the first metal layer comprises a first work function control portion;
forming a second work function control portion by forming a metal alloy with an upper portion of the first metal layer in the recess, wherein forming the metal alloy comprises implanting metal ions or diffusing metal atoms into the upper portion of the first metal layer in the recess, and wherein more of the metal alloy is in the second work function control portion than in the first work function control portion;
forming a source/drain region in the semiconductor substrate; and
forming a bit line structure on the source/drain region.

17. The method of claim 16, wherein forming the metal alloy comprises implanting the metal ions into the upper portion of the first metal layer in the recess.

18. The method of claim 16, wherein forming the metal alloy comprises:
forming a third metal layer in the recess; and
diffusing the metal atoms from the third metal layer into the upper portion of the first metal layer in the recess.

* * * * *